United States Patent
Fortune et al.

(10) Patent No.: US 12,250,785 B2
(45) Date of Patent: Mar. 11, 2025

(54) CARTRIDGE MODULE ALIGNMENT AND MOUNTING SYSTEM, APPARATUS AND METHOD

(71) Applicant: Swiss Vault Systems GmbH, Victoria (CA)

(72) Inventors: Doug Fortune, Sidney (CA); Bhupinder Bhullar, Basel (CH)

( * ) Notice: Subject to any disclaimer, the term of this patent is extended or adjusted under 35 U.S.C. 154(b) by 0 days.

(21) Appl. No.: 17/658,492

(22) Filed: Apr. 8, 2022

(65) Prior Publication Data

US 2023/0072634 A1   Mar. 9, 2023

Related U.S. Application Data

(60) Provisional application No. 63/241,605, filed on Sep. 8, 2021.

(51) Int. Cl.
*H05K 7/14* (2006.01)
*H05K 7/20* (2006.01)

(52) U.S. Cl.
CPC ....... *H05K 7/1489* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 4,836,789 A * | 6/1989 | Rudy, Jr. | H05K 7/1418 211/94.01 |
| 5,332,306 A | 7/1994 | Babb et al. | |
| 5,557,499 A | 9/1996 | Reiter et al. | |
| 6,015,196 A | 1/2000 | Welch et al. | |
| 6,729,383 B1 | 5/2004 | Cannell et al. | |
| 6,735,082 B2 | 5/2004 | Self | |
| 8,511,627 B2 | 8/2013 | Lutze | |
| 9,232,683 B2 | 1/2016 | Davis et al. | |
| 10,082,844 B2 | 9/2018 | Yang et al. | |
| 10,498,061 B1 * | 12/2019 | Blasick | H01R 24/50 |
| 10,856,436 B2 | 12/2020 | Van Pelt et al. | |
| 10,888,029 B2 | 1/2021 | Jochim et al. | |

(Continued)

FOREIGN PATENT DOCUMENTS

GB        673092 A   *  6/1952

*Primary Examiner* — James Wu
*Assistant Examiner* — Christopher L Augustin
(74) *Attorney, Agent, or Firm* — David Guerra

(57) ABSTRACT

A cartridge module alignment and mounting system, apparatus and method for mounting of a plurality of removable modules where the modules can be densely packed within the apparatus and where physical alignment of the module is maintained during insertion and removal so that the modules are easily connected or disconnected to a printed circuit board. The system includes an alignment pin affixable to the printed circuit board, and a carrier attachable to an electronic device such as a data storage device. The carrier can include a pin bore configured to receive a portion of the alignment pin thereby removably connecting and aligning the electronic device to the printed circuit board so that a space is defined between adjacent electronic devices. The space allows airflow or fluid flow to pass therebetween increasing heat dissipation of the electronic devices and the printed circuit board.

17 Claims, 20 Drawing Sheets

(56) References Cited

U.S. PATENT DOCUMENTS

2004/0216318 A1\* 11/2004 Charest ............. H01R 12/7005
33/645
2019/0272008 A1\* 9/2019 Ping ..................... H05K 7/1487
2021/0127522 A1\* 4/2021 Wang ................... H05K 7/1487

\* cited by examiner

CARTRIDGE MODULE ALIGNMENT AND MOUNTING SYSTEM, APPARATUS AND METHOD

CROSS-REFERENCE TO RELATED APPLICATION

This application claims the benefit of priority under 35 U.S.C. § 119(e) based upon U.S. provisional patent application Ser. No. 63/241,605 filed on Sep. 8, 2021. The entire disclosure of the prior provisional application is incorporated herein by reference.

BACKGROUND OF THE INVENTION

Technical Field

The present technology relates to a cartridge module alignment and mounting system, apparatus and method for use in connection with mounting of a plurality of removable modules where the modules can be densely packed within the apparatus and where physical alignment of the module is maintained during insertion and removal so that the modules are easily inserted or removed. The apparatus may further incorporate connectors for fluids, heat transfer, optical signals, or electrical signals. The apparatus may also incorporate means for facilitating control of the ambient temperature within the modules.

There has been considerable interest in apparatus that accommodate a plurality of removable modules, particularly for electrical and cartridge modules, including computer units (e.g., blade servers) and data storage devices (DSD's).

Background Art

The use of removable module mounting devices may be known in the prior art. U.S. Pat. No. 8,511,627 to Litze (2013) discloses an apparatus for fastening electrical units in a switchgear cabinet where each module can be slid into its shaped-rail supporting system. This apparatus has several advantages for switchgear cabinets including: good support during partial insertion of the modules so that wiring can be completed prior to complete insertion and it has grooves for screws or slide nuts to facilitate the immovable securing of the module in its final position. Although this apparatus provides for a convenient means for wiring and mounting electrical modules, dense packing of the modules is not an objective of this apparatus since the strip-shaped section 28, the mounting brackets 146, the groove for slide nuts 26, and groove for mounting screws 40 increase the overall size.

U.S. Pat. No. 9,232,683 to Davis and Worrall (2016) discloses an apparatus that provides vertical airflow for cooling to a plurality of drawers containing multiple DSD's. The warmed air can be exhausted horizontally or the warmed air can be cooled by air/liquid heat exchangers that can comprise part of the apparatus. Some of the advantages of vertical airflow are described therein, including reduced total spatial volume for the system.

U.S. Pat. No. 10,856,436 to Van Pelt and Stevens (2020) discloses an apparatus for mounting a plurality of storage modules that incorporates two levels of air movers that provide airflow for cooling multiple levels of electronic devices or drawers that house electronic devices. The orientation of the fans provides for a horizontal airflow at each level. Various embodiments reduce vibration from acoustic energy in the airflow by providing a means for shared airflow using larger fans (and having them farther away from the storage modules) rather than providing a separate means of airflow at each level. The main objective of this present technology is improved cooling with reduced vibration, largely because vibration can adversely affect the operation of conventional spinning DSD's.

U.S. Pat. No. 10,888,029 to Jochim et al. (2021) discloses a modular apparatus where each of the modular bays can accommodate computing devices, storage devices, or cooling devices (including air-to-liquid heat exchangers) thereby providing for flexibility in the allocation of modules for each purpose over the service lifetime of the apparatus. Dense packing of the individual modules, such as DSD's, is not addressed.

In applications where cooling of the modules is required, it is well known in the art that it is advantageous for the airflow to be turbulent rather than laminar, as described in U.S. Pat. No. 6,729,383 to Cannell et al. (2004) and U.S. Pat. No. 6,735,082 to Self (2004).

In existing apparatus for the mounting of removable modules, the removable modules often comprise the device providing the desired function (e.g., a DSD) plus a portion of the mounting system that is affixed to the device (e.g., with screws, clips, or adhesive). The portion of the mounting system is hereinafter referred to as the carrier. Alternatively, the function of the carrier can also be incorporated into the device, rather than being affixed to the device. Because the carrier is affixed to the device (or is incorporated into the device), the carrier is inserted into or removed from the apparatus along with that device. In the existing art, there are numerous disclosures of such carriers, especially for DSD's, including U.S. Pat. No. 10,082,844 to Yang et al. (2018); U.S. Pat. No. 6,015,196 to Welch and Obermeyer (2000); U.S. Pat. No. 5,557,499 to Reiter and Le (1996); and U.S. Pat. No. 5,332,306 to Babb and Madsen (1994). In all of these disclosures, the objective of the present technology is the ease of replacement of the module (e.g., alignment during module insertion and a means of securing the module in its proper position), rather than the dense packing of the devices. Ease of replacement is beneficial for DSD's because they need to be replaced more often than other components of a large data storage system. These existing carriers can increase the size of module in all three dimensions compared to the device thereby resulting in a significantly increased volume. For example, the rectangular volume of a disk drive mounted in its carrier in a Synology DS415+ data storage system is more than 30 percent larger than that of the device (a DSD) and there is additional volume occupied by the carrier's handle. Further, such existing carrier structures typically add undesirable weight and may also impede airflow, thereby reducing the heat transfer capabilities of the apparatus.

The need to accommodate a very large number of modules continues to be important, especially for large data storage systems. Although the capacity of individual DSD's keeps increasing, the requirement for data warehousing is increasing far more quickly, for example, the secure long-term storage of terabyte DNA sequences or the increasing amount of data from raw data accumulation, data analysis, and several other civilian and military applications.

Since large data storage systems can comprise hundreds or thousands of individual DSD's, improved spatial efficiency is of great benefit because it reduces the overall volume that is required for the apparatus thereby increasing the storage capacity of existing facilities such as data centers or allowing the use of smaller such facilities.

With DSD's and other devices that require controlled temperatures, this the spatial efficiency is further improved if the apparatus for mounting the modules can also provide a means for space-efficient heat transfer.

SUMMARY OF THE INVENTION

In view of the foregoing disadvantages inherent in the known types of removable module mounting devices now present in the prior art, the present technology provides a novel cartridge module alignment and mounting system, apparatus and method, and overcomes one or more of the mentioned disadvantages and drawbacks of the prior art. As such, the general purpose of the present technology, which will be described subsequently in greater detail, is to provide a new and novel cartridge module alignment and mounting system, apparatus and method and method which has all the advantages of the prior art mentioned heretofore and many novel features that result in cartridge module alignment and mounting system, apparatus and method which is not anticipated, rendered obvious, suggested, or even implied by the prior art, either alone or in any combination thereof.

According to one aspect, the present technology can include an electronic device mounting system including a carrier attachable to one or more electronic devices. The carrier can include a pin bore configured to receive an alignment pin affixed to a printed circuit board.

According to another aspect, the present technology can include an electronic device mounting system including one or more alignment pins affixable to a printed circuit board, and one or more carriers attachable to one or more electronic devices. The carriers can each include a pin bore configured to receive at least one of the alignment pins thereby removably connecting the electronic devices to the printed circuit board so that a space is defined between adjacent electronic devices.

According to still another aspect, the present technology can include an electronic device mounting system including one or more alignment pins affixable to a printed circuit board, and one or more carriers attachable to one or more electronic devices. The carriers can each include one or more drive bores configured to receive a device fastener that is configured to secure the carriers to the electronic devices, respectively. The carriers can each include a pin bore configured to receive at least one of the alignment pins thereby removably connecting the electronic devices to the printed circuit board so that a space is defined between adjacent electronic devices. The pin bore of the carriers can each include a first bore section that can have a first diameter or width, and a second bore section can have a second diameter or width greater than the first diameter or width. The second bore section can be adjacent the first bore section and an open end of the carriers. The alignment pins can each include a first pin section, a central pin section, a second pin section and a fastener bore. The first pin section can have a first pin diameter or width receivable in the first bore section. The central pin section can have a central pin diameter or width receivable in the second bore section. The central pin diameter or width of the central pin section can be greater than the first pin diameter or width of the first pin section. The second pin section can be adjacent to the central pin section so that the central pin section is between the first pin section and the second pin section. The second pin section can have second pin diameter or width greater than the central pin section. The fastener bore can be configured to operable receive a pin fastener configured to affix the alignment pins to the printed circuit board.

According to yet another aspect, the present technology can include an electronic device mounting system including one or more alignment pins, one or more carriers, one or more printed circuit boards, and a housing configured to support and/or enclose the alignment pins, the carriers and the printed circuit board. The alignment pins can each be affixable to the printed circuit board. The carriers can be attachable to one or more electronic devices, and can each include a pin bore configured to receive at least one of the alignment pins thereby removably connecting the electronic devices to the printed circuit board so that a space is defined between adjacent electronic devices.

According to still yet another aspect, the present technology can include a method of mounting an electronic device to a printed circuit board using an electronic device mounting system. The method can include the steps of attaching a carrier to one or more electronic devices. Then, mounting the electronic devices to the printed circuit board by sliding the carrier onto an alignment pin affixed to the printed circuit board so that the alignment pin is received in a pin bore defined in the carrier.

In some or all embodiments, the carrier can further include one or more drive bores configured to receive a fastener configured to secure the carrier to the electronic devices.

In some or all embodiments, the pin bore of the carrier can include a first bore section having a first diameter or width, and a second bore section having a second diameter or width greater than the first diameter or width. The second bore section can be adjacent the first bore section and an open end of the carrier.

In some or all embodiments, the alignment pin can include a first pin section that can have a first pin diameter or width receivable in the first bore section, and a central pin section that can have a central pin diameter or width receivable in the second bore section. The central pin diameter or width of the central pin section can be greater than the first pin diameter or width of the first pin section.

In some or all embodiments, the alignment pin can include a second pin section adjacent to the central pin section so that the central pin section is between the first pin section and the second pin section. The second pin section can have second pin diameter or width greater than the central pin section.

In some or all embodiments, the alignment pin can define a fastener bore configured to operable receive a pin fastener configured to affix the alignment pin to the printed circuit board.

In some or all embodiments, the electronic devices can be a data storage device.

Some or all embodiments of the present technology can include a means of restricting movement of the electronic devices along the alignment pin, the means of restricting movement is selected from the group consisting of magnets, mechanical fasteners, a translational detent, by inclining the alignment pin above a horizontal plane, and a door on an enclosure containing the printed circuit board and the electronic devices.

In some or all embodiments, the printed circuit board can include one or more connectors for a transfer of one or combination of power, electrical signals, heat, optical signals or fluids between the printed circuit board and the electronic devices.

Some or all embodiments of the present technology can include an enclosure configured to enclose the printed circuit board, the alignment pin and the electronic devices.

In some or all embodiments, the alignment pin can be a plurality of alignment pins arranged on the printed circuit board. The carrier and the electronic devices attached to the carrier form a cartridge module. Each of the alignment pins can be configured to support the cartridge module so that multiple cartridge modules are arranged in a back-to-back and/or side-to-side configuration defining a space provided between backsides of the cartridge modules.

In some or all embodiments, the space can be a plenum space for airflow or fluid flow.

In some or all embodiments, the space for the airflow or fluid flow can be provided between one or more horizontal rows of the cartridge modules or between one or more vertical columns of the cartridge modules.

Some or all embodiments of the present technology can include one or more fans to provide airflow or fluid flow through the space.

In some or all embodiments, the carrier can include multiple carrier sections each including the pin bore and each being attachable to at least one of the electronic devices.

Some or all embodiments of the present technology can include a tool configured to support the electronic devices with the carrier attached to the electronic devices. The tool can include a handle section configured to be grasped by a hand of a user or configured to be attachable to a hand grip. The tool can include a pair of side sections in a spaced apart relationship configured to receive an edge of the electronic devices therebetween, and each of the side sections can include one or more recesses configured to receive a part of the electronic devices or a fastener associated with the electronic devices.

The improved alignment and mounting apparatus disclosed herein allows for ease of module insertion or removal while requiring a comparatively small amount of spatial volume for the carrier, typically only five to ten percent of the volume of the functional device thereby reducing cost, weight, complexity and airflow impediments.

Several means for securing the modules within the apparatus are also disclosed.

To accommodate cases where the modules dissipate heat or require ambient temperature control, means of heat transfer, including providing channels for airflow, coolant or equivalent, are disclosed.

There has thus been outlined, rather broadly, features of the present technology in order that the detailed description thereof that follows may be better understood and in order that the present contribution to the art may be better appreciated.

Numerous objects, features and advantages of the present technology will be readily apparent to those of ordinary skill in the art upon a reading of the following detailed description of the present technology, but nonetheless illustrative, embodiments of the present technology when taken in conjunction with the accompanying drawings.

As such, those skilled in the art will appreciate that the conception, upon which this disclosure is based, may readily be utilized as a basis for the designing of other structures, methods and systems for carrying out the several purposes of the present technology. It is, therefore, that the claims be regarded as including such equivalent constructions insofar as they do not depart from the spirit and scope of the present technology.

It is therefore an object of the present technology to provide a new and novel cartridge module alignment and mounting system, apparatus and method that has all of the advantages of the prior art removable module mounting devices and none of the disadvantages.

It is another object of the present technology to provide a new and novel cartridge module alignment and mounting system, apparatus and method that may be easily and efficiently manufactured and marketed.

An even further object of the present technology is to provide a new and novel cartridge module alignment and mounting system, apparatus and method that has a low cost of manufacture with regard to both materials and labor, and which accordingly is then susceptible of low prices of sale to the consuming public, thereby making such cartridge module alignment and mounting system, apparatus and method economically available to the buying public.

Still another object of the present technology is to provide a new cartridge module alignment and mounting system, apparatus and method that provides in the apparatuses and methods of the prior art some of the advantages thereof, while simultaneously overcoming some of the disadvantages normally associated therewith.

These together with other objects of the present technology, along with the various features of novelty that characterize the present technology, are pointed out with particularity in the claims annexed to and forming a part of this disclosure. For a better understanding of the present technology, its operating advantages and the specific objects attained by its uses, reference should be made to the accompanying drawings and descriptive matter in which there are illustrated embodiments of the present technology. Whilst multiple objects of the present technology have been identified herein, it will be understood that the claimed present technology is not limited to meeting most or all of the objects identified and that some embodiments of the present technology may meet only one such object or none at all.

BRIEF DESCRIPTION OF THE DRAWINGS

The present technology will be better understood and objects other than those set forth above will become apparent when consideration is given to the following detailed description thereof. Such description makes reference to the annexed drawings wherein.

The same reference numerals refer to the same parts throughout the various figures.

DETAILED DESCRIPTION OF THE EMBODIMENTS

While the above-described devices fulfill their respective, particular objectives and requirements, the aforementioned devices or systems do not describe a cartridge module alignment and mounting system, apparatus and method that allows mounting of a plurality of removable modules where the modules can be densely packed within the apparatus and where physical alignment of the module is maintained during insertion and removal so that the modules are easily inserted or removed.

A need exists for a new and novel cartridge module alignment and mounting system, apparatus and method that can be used for mounting of a plurality of removable modules where the modules can be densely packed within the apparatus and where physical alignment of the module is maintained during insertion and removal so that the modules are easily inserted or removed. In this regard, the present technology substantially fulfills this need. In this respect, the cartridge module alignment and mounting system, apparatus and method according to the present technology substantially departs from the conventional concepts and designs of the prior art, and in doing so provides an apparatus primarily developed for the purpose of mounting of a plurality of removable modules where the modules can be densely packed within the apparatus and where physical alignment of the module is maintained during insertion and removal so that the modules are easily inserted or removed.

In the following description, for purposes of explanation and not limitation, specific details are set forth, such as particular embodiments, procedures, techniques, etc. in order to provide a thorough understanding of the present technology. However, it will be apparent to one skilled in the art that the present technology may be practiced in other embodiments that depart from these specific details.

Figure 1:
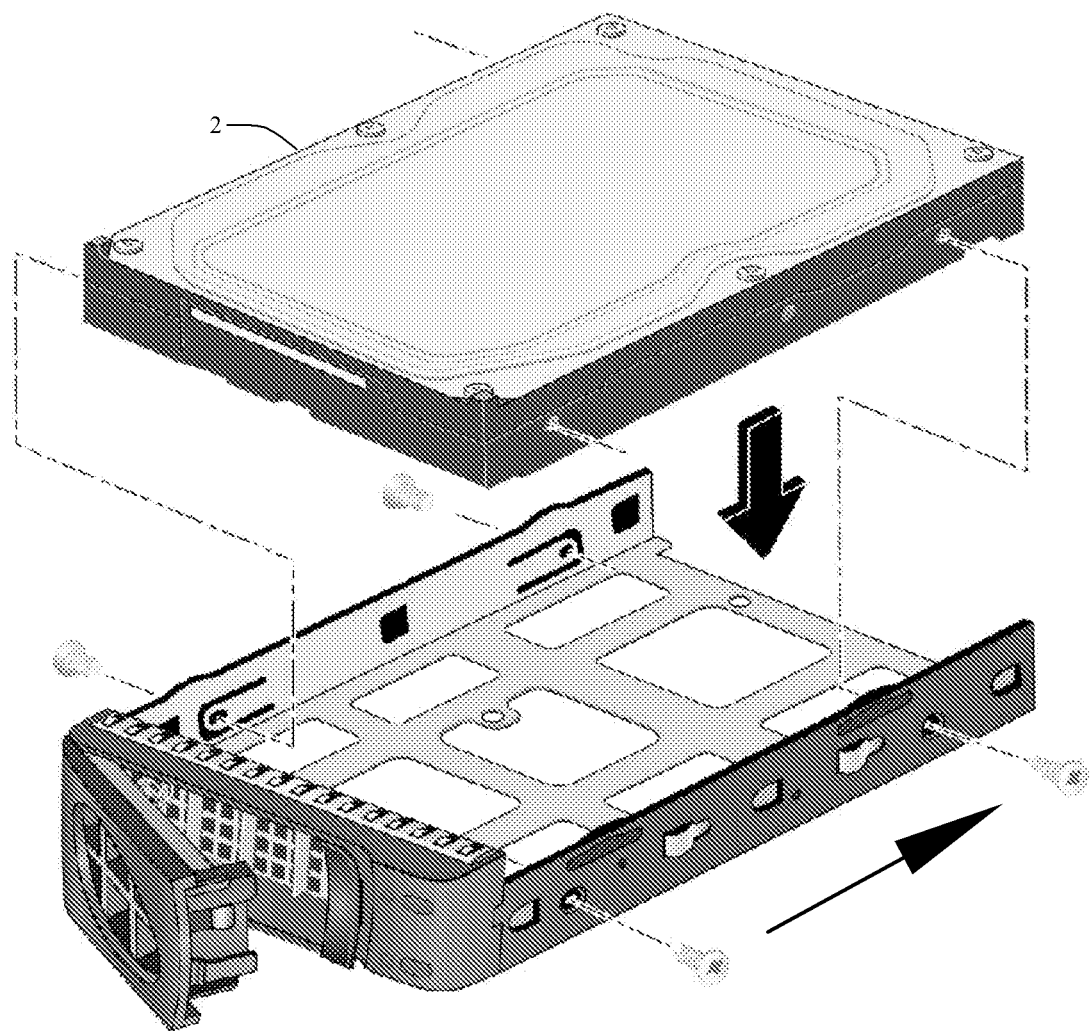
FIG. 1 is a perspective view of a DSD mounting system known in the prior art.

Electronic drive mounting devices are known in the art, as shown in FIG. 1, with these known devices typically including a plastic housing that completely encases the electronic drive 2. The housing do include openings or slots allow for some heat dissipation, however, the encasing nature of the housing limits or prevents sufficient air flow around the electronic drive for cooling. This is in part due to the enclosing configuration of these known devices, which limits the amount of surface contact with a cooling medium such as air. The arrow in the direction from the front of the known mounting device toward the back indicates the normal horizontal front-to-back airflow known with these mounting devices.

It can be appreciated that these known drive mounting devices have significant disadvantages in heat dissipation or cooling of the electronic drive, and for allowing dense compact mounting of multiple drives since the enclosure takes up space in the enclosure.

Referring now to the drawings, and particularly to FIGS. 2A-26, embodiments of the cartridge module alignment and mounting system, apparatus and method of the present technology are shown.

Figure 2A:
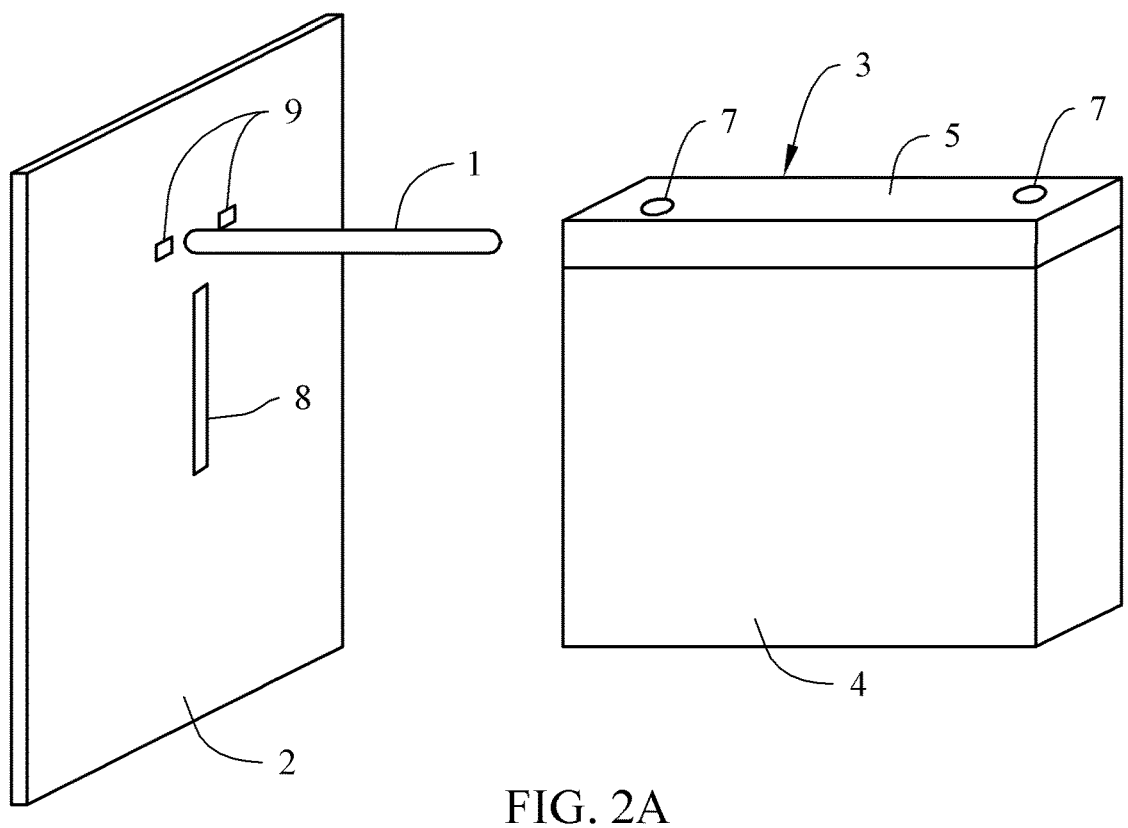
FIG. 2A is an oblique pictorial view showing the module separated from the alignment pin and supporting structure.
Figure 2B:
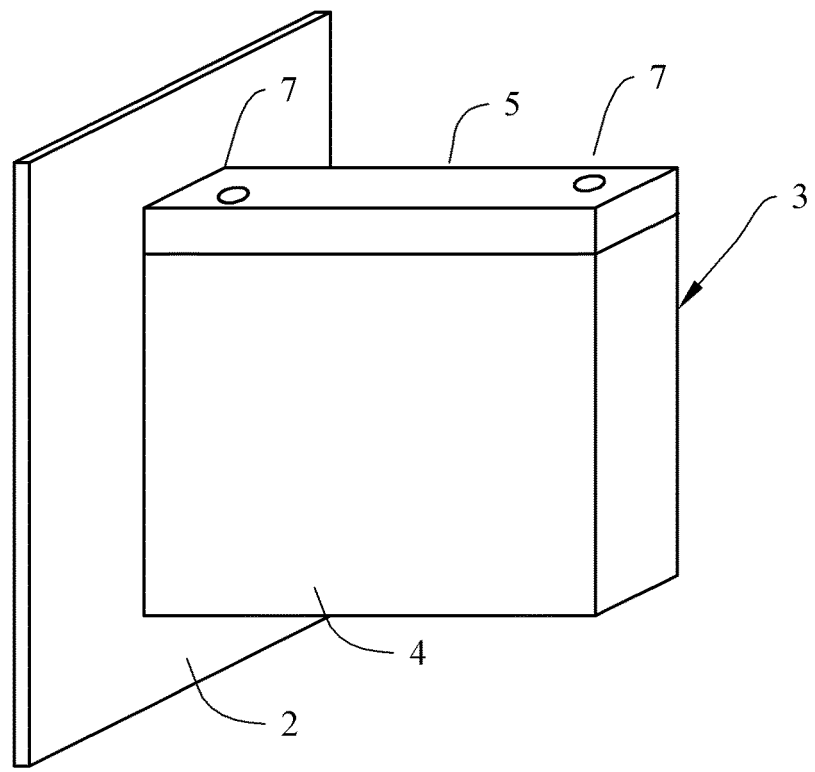
FIG. 2B is an oblique pictorial view showing the module placement after sliding the module onto the alignment pin.

Hereinafter, the term device refers to that portion of the module containing the functional unit to be stored by the apparatus, e.g., a DSD in a data storage system. In FIG. 2A, each removable module 3 consists of one or more devices 4 and one or more carriers 5. FIG. 2A shows a single carrier 5 mounted to the top of a device 4, but embodiments of this present technology can have a plurality of carriers 5 mounted on the device 4 or a plurality of devices 4 mounted on a single carrier 5.

The supporting structure 2 can be a mechanical support or any combination of a mechanical support and devices or structures that transfer electrical signals, heat, or fluids. Exemplary supporting structures 2 include sheet metal, printed circuit boards (PCB's), manifolds for the transfer of fluids, or any combination thereof.

Each alignment pin 1 is affixed to the supporting structure 2 using means known in the art including, but not limited to, where the alignment pin 1 has an external thread and there is a matching threaded nut on the opposite side of a hole in the supporting structure 2; where the alignment pin 1 has an internal thread and there is a screw 7 on the opposite side of a hole in the supporting structure 2; where the alignment pin 1 is affixed to the supporting structure 2 using metallurgical means such as soldering, brazing, or welding; where the alignment pin 1 is affixed to the supporting structure 2 using adhesive; and where there is an interference fit between the alignment pin 1 and its corresponding hole in the supporting structure 2 and the alignment pin 1 is pressed into the corresponding hole.

Each device 4 is attached to its respective carrier 5 or carriers 5 wherein each carrier 5 has one or more holes 6 that are the counterparts of respective alignment pins 1 on the supporting structure 2. Suitable means of the attachment are known in the art and may be, for example, mechanical (e.g., screws 7, clips, or brackets), adhesive (including adhesive tapes), or magnetic attraction. For clarity, FIG. 2A shows a single alignment pin 1 and a single module 3 and does not show the hole 6.

The module 3 may further be connected to the supporting structure 2 by one or more connectors 8 for any purpose or combination of purposes including, but not limited to physical support, transfer of power, transfer of electrical signals, transfer of heat, transfer of optical signals, transfer of fluids, or any combination thereof between the supporting structure 2 and one or more of the modules 3. In FIG. 2A, the connector 8 is a pictorial representation of any type of connector or group of connectors.

In addition to providing a means for alignment when the module 3 is inserted into the apparatus, any alignment pin 1 may additionally provide physical support for a module 3, essentially acting as a cantilever beam. This is particularly beneficial when the module 3 is oriented in the vertical position and when the alignment pin 1 is horizontal (or nearly horizontal), as shown in FIG. 2A and for its exemplary assembled embodiment in FIG. 2B. Because the center of mass of the device 4 in this exemplary embodiment is well below the alignment pin 1, gravity tends to naturally orient the device 4 in the vertical position thereby facilitating module alignment during insertion.

FIG. 2A shows a single alignment pin 1 for each module 3. In alternative embodiments there could be a plurality of alignment pins 1 for each module 3 for reasons including: providing additional physical support, eliminating the aforementioned reliance on gravity to aid alignment, or when gravitational alignment provides insufficient accuracy of alignment during insertion. A plurality of alignment pins 1 would also be of benefit when the alignment pins 1 are vertical (or nearly vertical) because gravity would not assist in the alignment of the module 3.

Figure 2C:
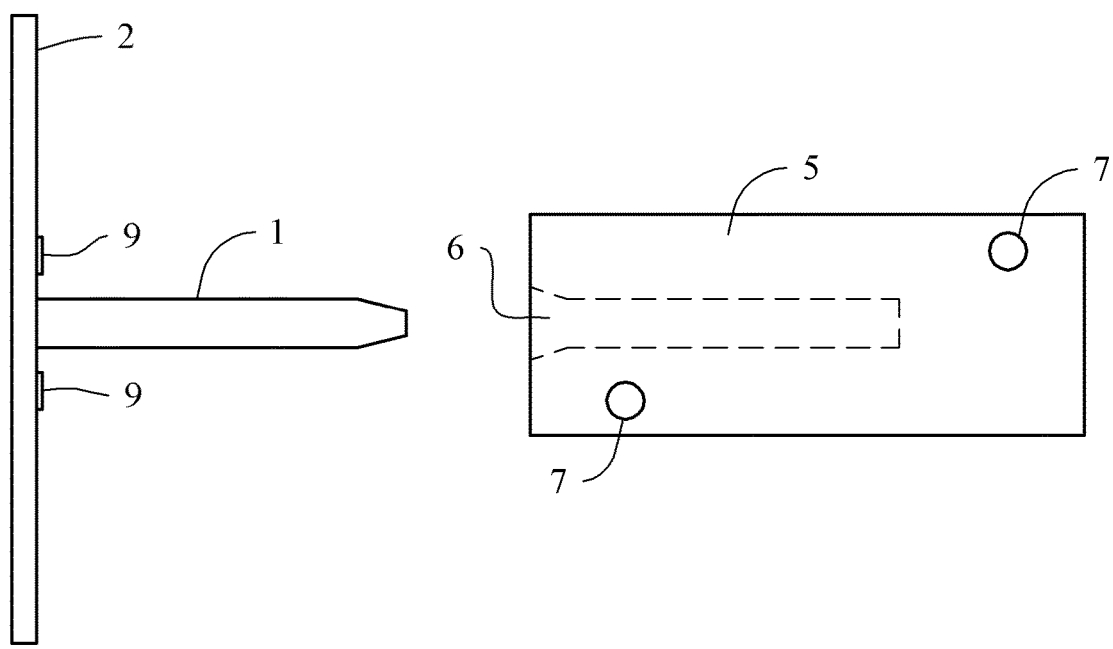
FIG. 2C is a top view showing a pin having a tapered end and a carrier having a chamfered hole.

In one embodiment of the present technology, a chamfer, counterbore or taper can be provided in the hole 6, on the pin 1, or both to facilitate alignment when inserting the modules 3 onto the alignment pin 1 and into the apparatus. FIG. 2C shows an exemplary taper at the end of the alignment pin 1 and an exemplary chamfer in the hole 6.

Figure 2D:
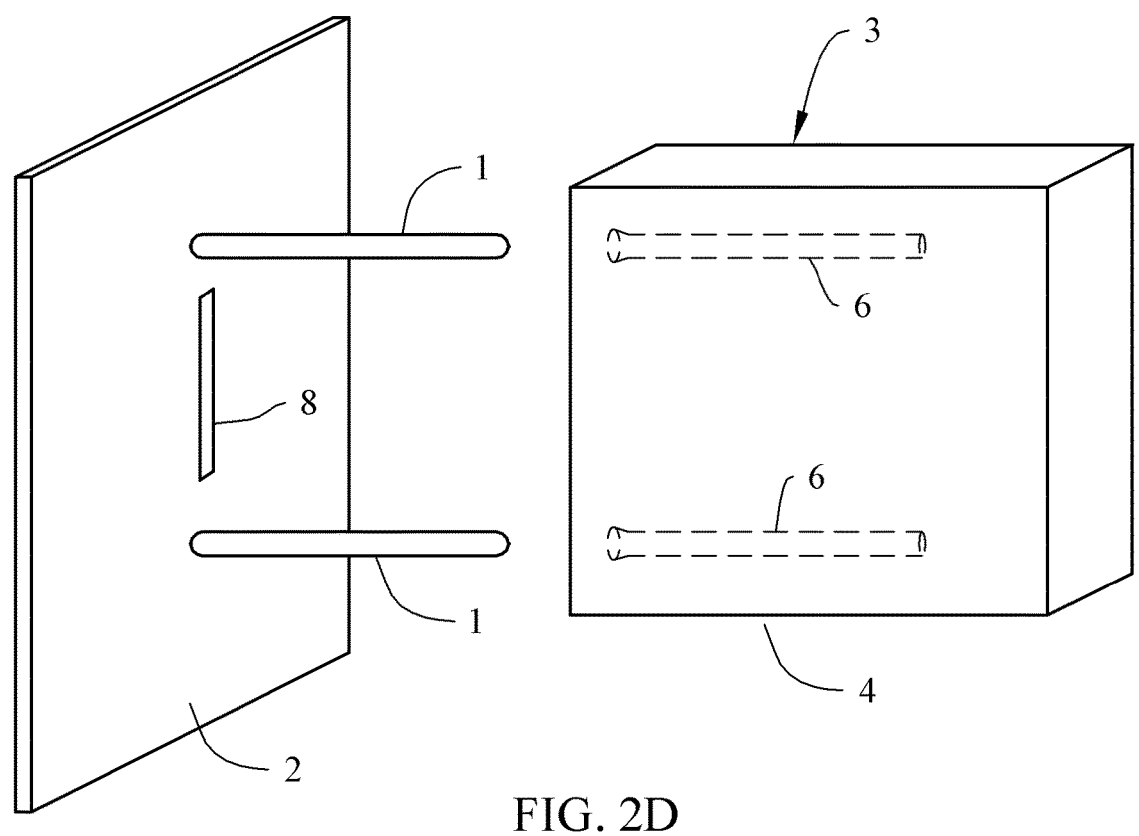
FIG. 2D is an oblique pictorial view showing the incorporation of the function of the carrier into the device and further showing the use of a plurality of alignment pins with a single module.

In some embodiments of the present technology, it could be beneficial to incorporate the function of the carrier 5 and the device 4 shown in FIG. 2A into an integrated module 3, as illustrated in FIG. 2D. In the exemplary embodiment in FIG. 2D, the device 4 constitutes the entire module 3 and it therefore has one or more holes 6 that are the counterparts of the corresponding alignment pins 1. A potential benefit of this embodiment is a reduction in the total spatial volume of the module 3 when compared to having a separate device 4 and carrier 5. As an illustrative example, a DSD could be manufactured having a hole that accommodates the alignment pin 1, thereby reducing the space requirement for the module 3 because there is no longer a requirement for a separate carrier 5. In the current state of the art for DSD's, the accommodation would be straightforward especially if the DSD is a solid-state drive (SSD). FIG. 2D also discloses an illustrative embodiment of the use of a plurality of alignment pins 1 per module 3.

Although FIGS. 2A through 2D each show a single module 3, in one or all embodiments there is provided a plurality of alignment pins 1 that are affixed to a supporting structure 2 to accommodate a corresponding plurality of modules 3.

Figure 3A:
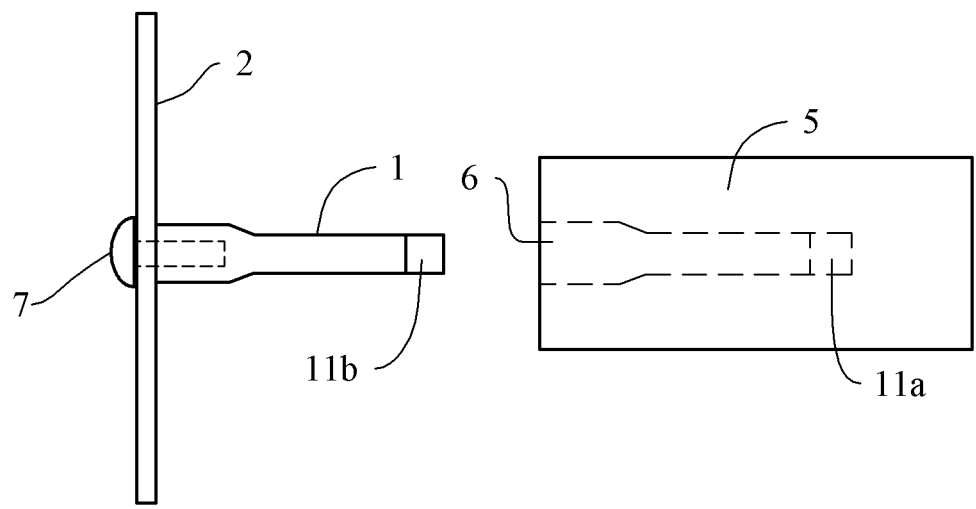
FIG. 3A is a top view showing the use of magnets to restrict the movement of the carrier and showing an alignment pin having an enlarged diameter at the base to accommodate a retaining screw.

In one or all embodiment the modules 3 are restricted from sliding away from the supporting structure 2 after they are inserted. This would be important, for example, to ensure that connectors 8 remain properly seated. In accordance with another aspect of this present technology, FIG. 3A shows a first such means of the restriction by affixing a magnet 11a inside of the hole 6 in the carrier 5 or affixing a magnet 11b to the end of the alignment pin 1, or, as illustrated, using both of these magnets in the positions. When a single magnet is used, the matching counterpart is preferably ferromagnetic, e.g., magnet 11a with a steel alignment pin 1. Exemplary means of affixment of the magnet 11a or 11b to the carrier 5 or the alignment pin 1, respectively, include adhesives, clips, screws, or magnetic attraction. Furthermore, the end of the alignment pin 1 could be counterbored to accommodate the magnet 11b and magnet 11b would, accordingly, need to be of a size small enough to fit within the counterbore. FIG. 3A also illustrates an embodiment wherein the alignment pin 1 is affixed to the supporting structure 2 using aforementioned internal threads in the alignment pin 1 and a screw 7 along with the aforementioned use of chamfers to facilitate alignment.

Figure 3B:
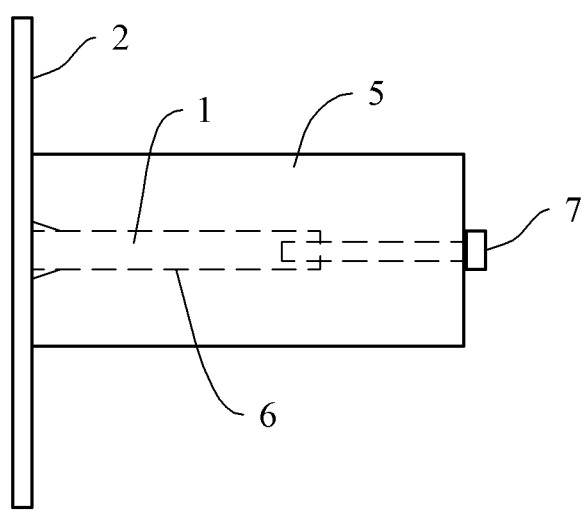
FIG. 3B is a top view showing the use of a screw to restrict the movement of the carrier.

FIG. 3B illustrates another exemplary means of the restriction by using a mechanical fastener such as a screw 7 through a hole in the carrier 5 and into a threaded hole in the alignment pin 1.

Figure 3C:
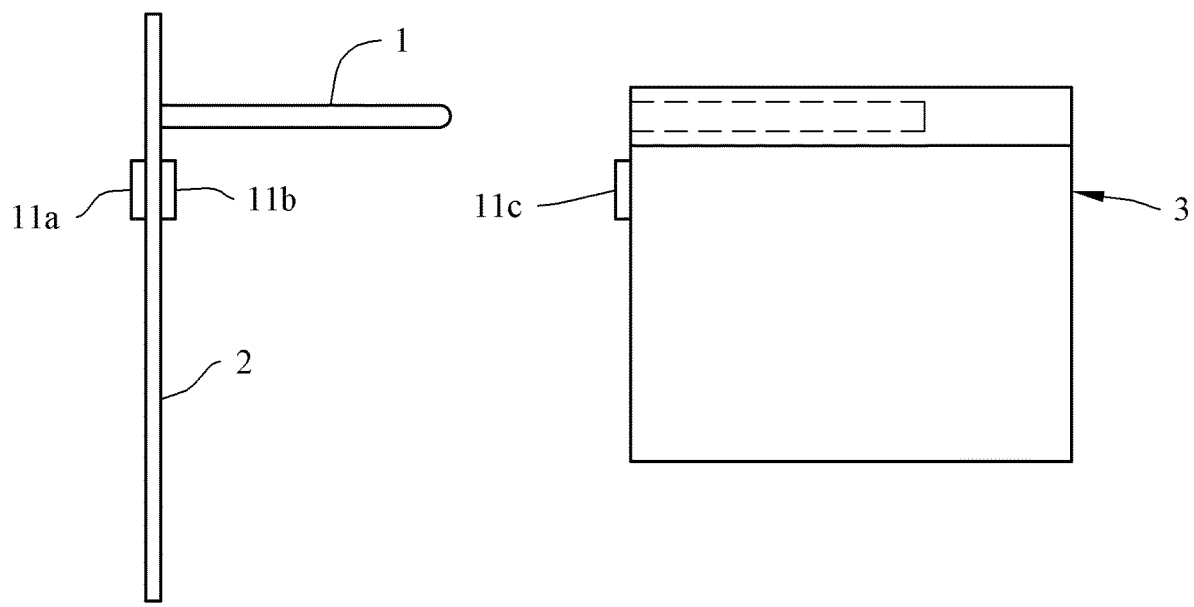
FIG. 3C is a side view showing the use of magnets to restrict the movement of the carrier.

FIG. 3C illustrates further magnetic means of restricting the module 3 from moving away from the supporting structure 2. The placement of one or more magnets depends on the magnetic properties of the supporting structure 2 and the module 3 as well as the required force of the magnetic attraction for a particular embodiment. For example, if the supporting structure 2 is a ferromagnetic material such as mild steel, then only the magnet 11c may be required. If more magnetic force is required, then an additional magnet 11b or 11c can be used. Whereas, if neither the supporting structure 2 nor the module have good magnetic properties, then a magnet 11c plus a magnet 11a or 11b would be required.

In certain embodiments, the cross section of the alignment pin 1 may be circular. An advantage of a circular cross section is that the corresponding circular hole 6 in the carrier 5 is simple to fabricate. However, a circular cross section does not restrict the rotation of the module 3 around the alignment pin 1. To restrict the rotation of the module 3 around the alignment pin 1 a non-circular cross section such as a rectangular cross section may be used, which may be beneficial in certain embodiments of this present technology.

Figure 4:
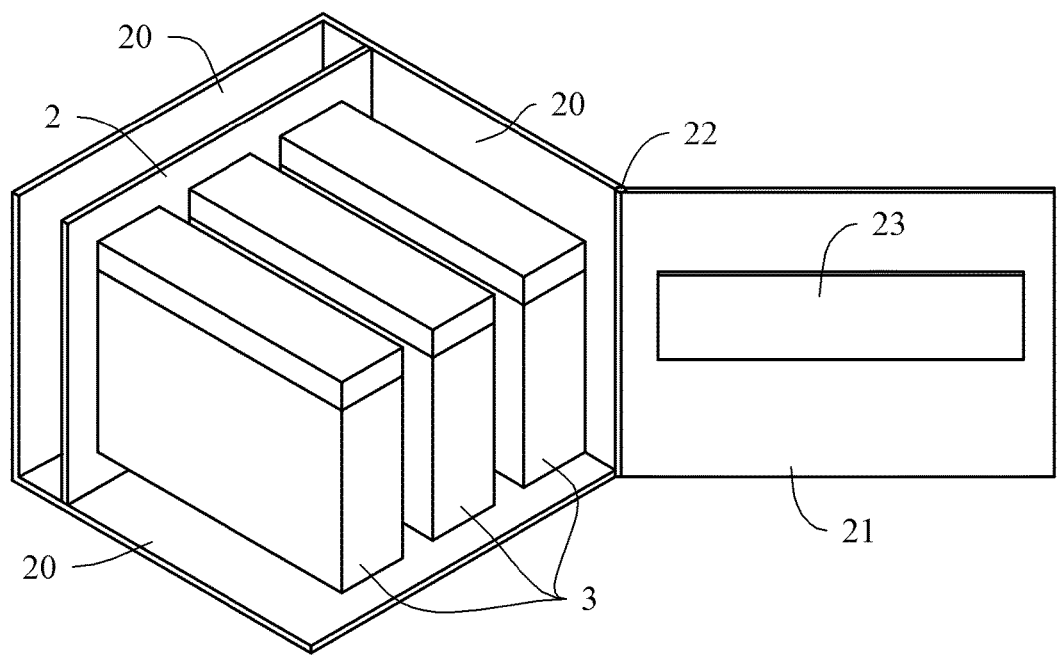
FIG. 4 is an isometric view of three modules mounted on a supporting structure that is further mounted inside of an enclosure having a hinged door.

FIG. 4 illustrates a further exemplary means of restricting the movement of the modules 3 by having a close-fitting door 21 with a hinge 22 on an enclosure 20 that contains the supporting structure 2 and a plurality of modules 3 where the geometry of the enclosure 20 and the door 21 are such that, when the door 21 is closed, it prevents the modules 3 from sliding along their corresponding alignment pins 1. For clarity in FIG. 4, only three walls of the enclosure 20 are shown, even though the enclosure 20 typically has five walls plus the door 21, thereby completely enclosing the supporting structure 2 and the modules 3. The door 21 is shown in a partially opened position. An elastomeric strip 23 such as EDPM rubber may be attached to the inside of the door 20 to provide a force that helps to restrict the movement of the modules 3 when the door 20 is closed. In an embodiment of the present technology, the supporting structure 2 could serve as a wall of the enclosure 20. In some embodiments, it may be beneficial to provide a removable access panel in place of the door 21.

With reference to FIG. 4, additional system components can be mounted on the back side of the supporting structure 2, i.e., mounted on the side of the supporting structure 2 that is opposite to where the modules 3 are mounted. This embodiment is well-suited for large data storage systems since additional system components can be mounted on the opposite side. The additional system components include, but are not limited to, CPUs, single-board computers, data storage devices, cabling, communications interfaces, power supplies, or any combination thereof. These components may be spatially arranged in a configuration that is unrelated to the configuration of the modules 3 and a separate means of heat transfer may be used in the space between the back side of the supporting structure 2 and the walls of the enclosure 20 to meet the heat transfer requirements of the additional components. For example, a CPU and power supply may require a different airflow or equivalent flow rate than a plurality of modules 3 containing DSD's that are mounted on the front side of the supporting structure 2.

The material used for the carrier 5 can be selected to have properties that are beneficial for a particular embodiment. The material could be selected for its mechanical strength (e.g., steel), corrosion resistance (e.g., plastic or stainless steel), heat transfer characteristics (e.g., thermally-conductive materials such as copper, aluminum, other metals, or alloys thereof) or its optical properties (e.g., transparent PMMA or polycarbonate plastic). Means of manufacture of the carrier 5 are well known in the art and include machining, casting, injection molding, and 3-D printing.

As a first illustrative example of suitable materials for the carrier 5, an aluminum carrier 5 could conduct heat from the device 4, thereby increasing the total heat radiating surface area of the module 3. Furthermore, a carrier 5 could be thermally connected to the supporting structure 2 thereby conducting heat from the device 4 to a heat-exchange mechanism that is incorporated into the supporting structure 2. Further, the heat-exchange mechanism could incorporate a circulating coolant (e.g., a fluid coolant), Peltier cooling, or any combination thereof, thereby increasing the rate of heat transfer. The coolant could circulate within the supporting structure 2, within the carrier 5, or any combination thereof.

As a second illustrative example of suitable materials for the carrier 5, when the devices 4 are electronic devices such as DSD's, a transparent carrier 5 allows for the transmission of light from proximity of the supporting structure 2 (e.g., a PCB) through the carrier 5 so that a plurality of system status indicators such as LED's 9 can be easily viewed by the system operator. Although the LED's 9 are illustrated only in FIG. 2A, they could be used in other embodiments disclosed herein.

Figure 5A:
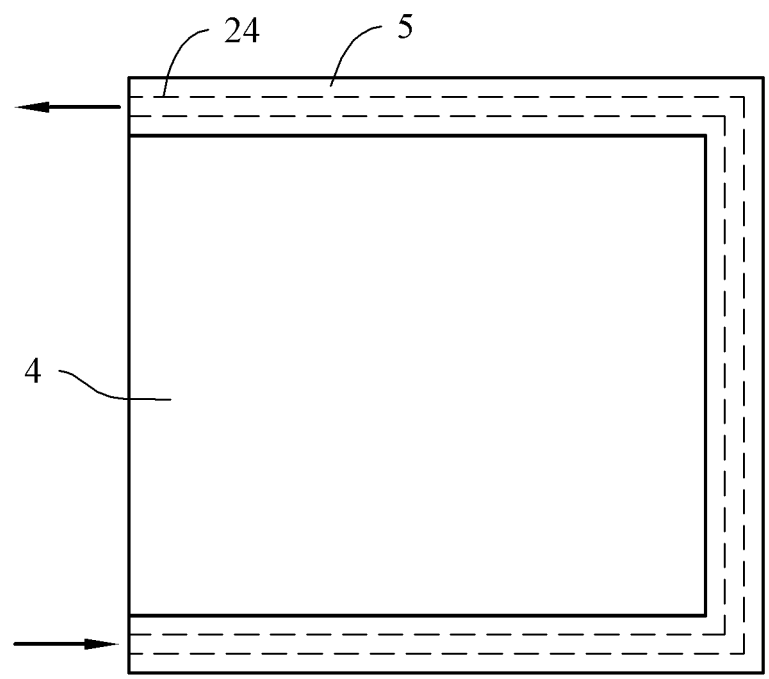
FIG. 5 is a side view of modules having a wraparound carrier that may also provide a means of heat transfer using a fluid.
Figure 5B:
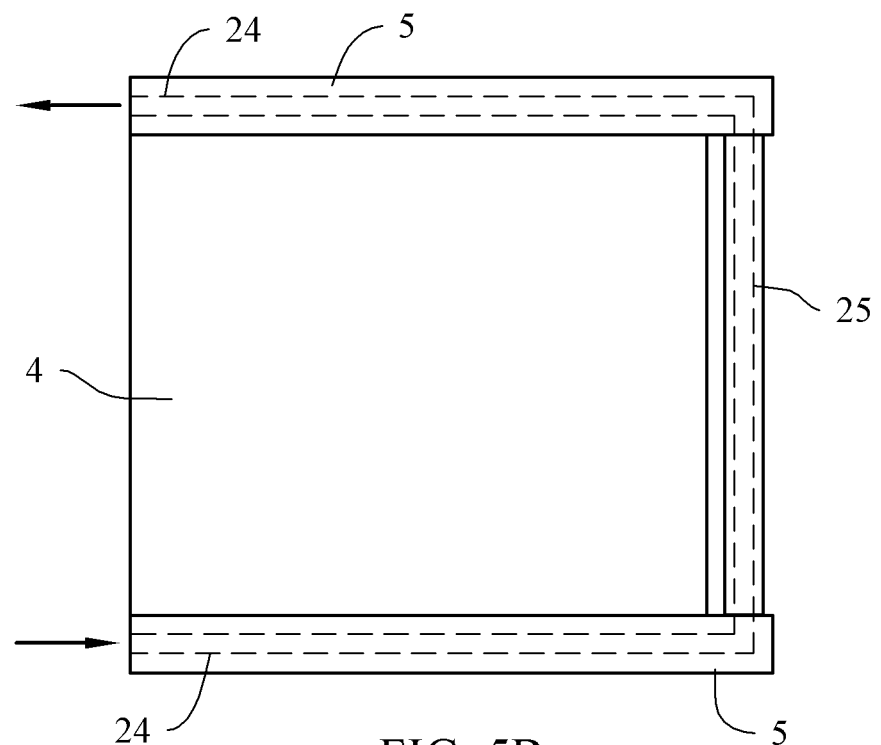

In another embodiment of this present technology, the carrier 5 could further extend around the periphery of the device 4, as shown in FIG. 5A. This embodiment would be particularly beneficial when a high rate of heat transfer is required, whether by thermal conduction alone or by using a fluid coolant circulating inside of channels 24 within the carrier 5 as is indicated by the arrows. The extended carrier 5 could be fabricated as a single piece or it could comprise multiple sections that are fastened together. It could also consist of heterogeneous sections as exemplified in FIG. 5B where the upper and lower sections of the carrier 5 are connected by a section consisting of a tube 25 for coolant circulation. The shape of the internal channel 24 for the circulating coolant is not shown in FIG. 5A or 5B and the channel shape and its dimensions are not facets of this present technology. In certain embodiments, the function of the carrier 5 that extends around the periphery of the device 4 could be incorporated into the device 4.

Figure 6A:
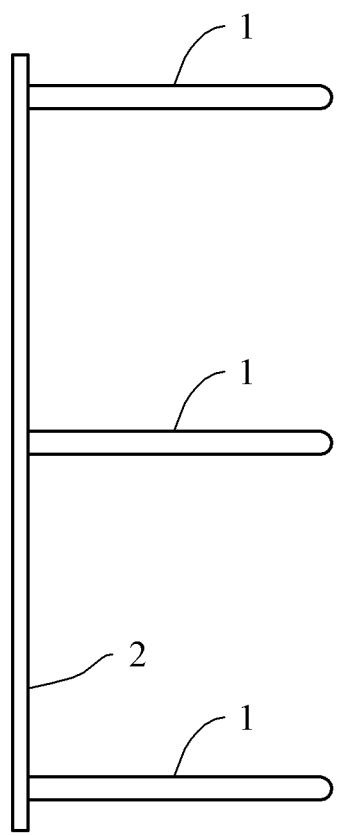
FIG. 6A shows a top view a removable tray that supports multiple devices.
Figure 6A:
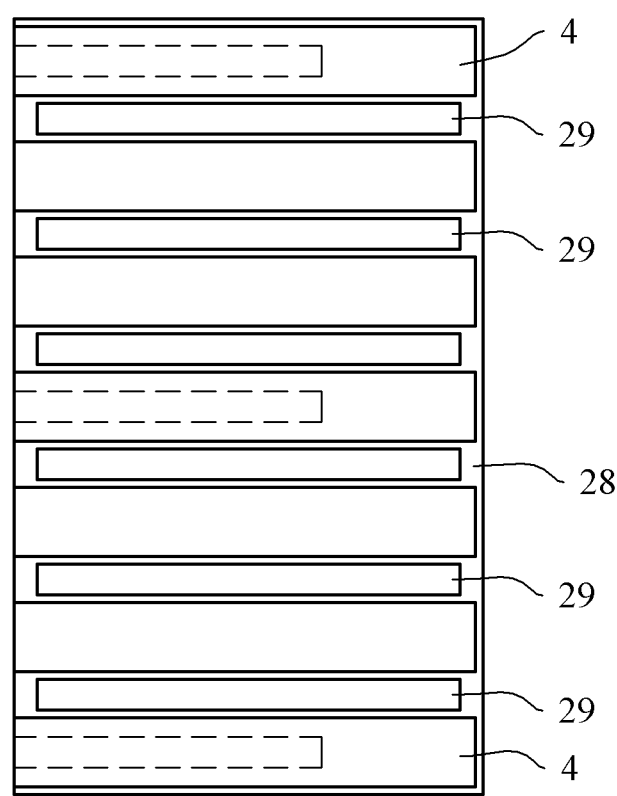
Figure 6B:
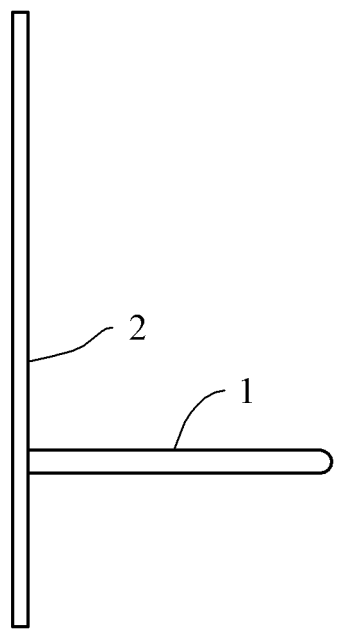
FIG. 6B shows a side orthographic view of the removable tray that supports multiple devices.
Figure 6B:
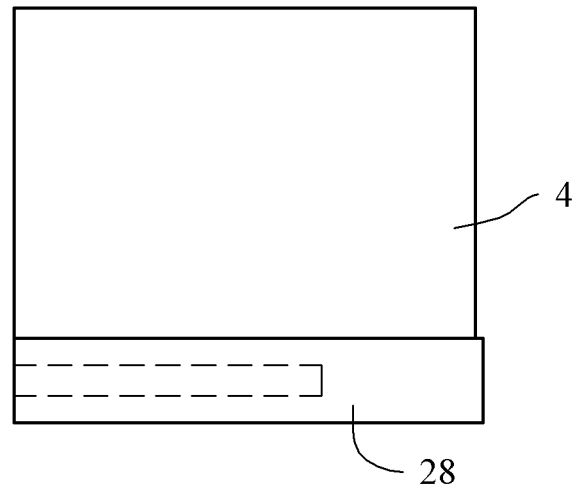

FIGS. 6A and 6B illustrates top and side views of an embodiment where a tray 28 acts as a carrier 5 that supports a plurality of devices 4 wherein each device 4 is attached to the tray 28 using aforementioned means. In the top view, it can be seen that the devices 4 are spaced in the horizontal direction and, to facilitate cooling of the devices 4, there are slots 29 in the tray 28 to allow vertical airflow or equivalent between the devices 4. However, the slots may not be required in some embodiments, especially if there is no need for cooling airflow or equivalent. In this figure, the tray 28 and alignment pins 1 are shown to be underneath of the devices 4 but this embodiment is also well-suited for use when the tray 28 and alignment pins 1 are above the devices 4. The hidden lines in FIGS. 6A and 6B are the holes in the tray 28 that accommodate the alignment pins 1. Advantages of this embodiment are that it is suitable for applications where the simultaneous insertion and removal of a plurality of devices 4 is required and also that fewer alignment pins 1 may be required. The tray 28 can be prevented from moving away from the supporting structure 28 using means such as those illustrated in FIGS. 3A-3C or otherwise disclosed herein.

Figure 7:
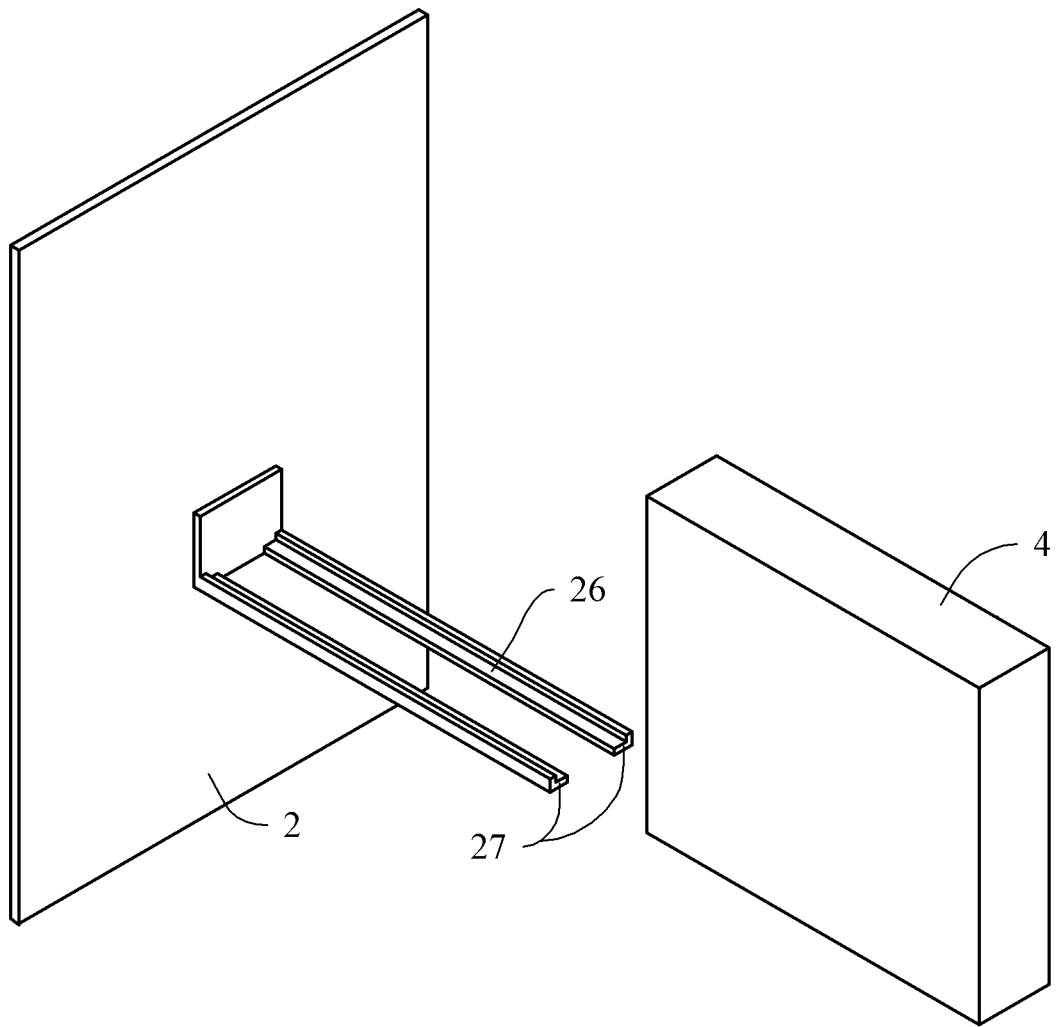
FIG. 7 is an isometric view of a tray that is affixed to the supporting structure and supports a removable device.

In a further embodiment of the present technology, the device 4 could be supported by a tray 26 that is mounted to the supporting structure 2. FIG. 7 illustrates such a tray 26 wherein the tray incorporates a mounting bracket that can be attached to the supporting structure 2 using aforementioned means. FIG. 7 illustrates an embodiment of such a tray 26 wherein the tray has raised edges around its periphery to prevent lateral movement of the device 4 after it is placed in position inside of the tray 26. The tray 26 in FIG. 7 is further shown to have a split configuration wherein there is no material between the fingers 27 that protrude away from the supporting structure 2. Compared to a continuous tray, an advantage of the split configuration is that more of the surface of the device 4 is exposed to any cooling airflow.

Although the tray 26 shown in FIG. 7 is illustrated as supporting a single device 4, those skilled in the art will realize that a tray 26 having a mounting bracket could be fabricated to support a plurality of devices 4. The tray 26 can be fabricated using means known in the art such as casting or stamping.

Figure 8:
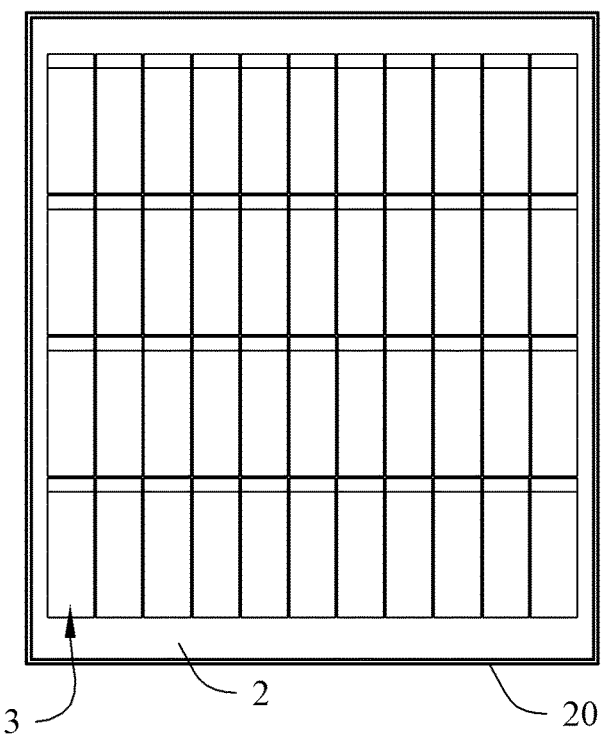
FIG. 8 is a front view of a plurality of densely-packed modules inside of an optional enclosure.

FIG. 8 is an illustrative embodiment showing a dense packing of a plurality of modules 3 where each module 3 has been inserted along its corresponding alignment pin such that it is in proximity to the supporting structure 2. The modules are shown within an optional enclosure 20. This embodiment is suitable when the modules 3 do not require significant cooling.

Figure 9:
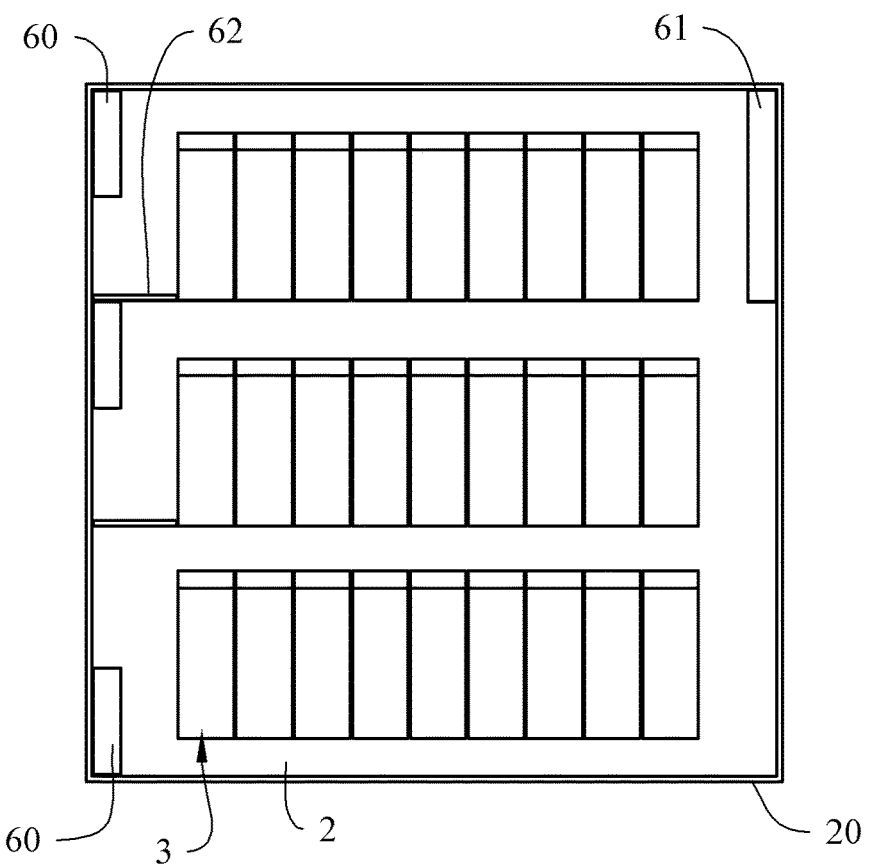
FIG. 9 is a front view of rows of modules where there are air channels between the rows.

In another illustrative embodiment, shown in FIG. 9, there are air spaces between the rows of modules 3 and a means of cooling such as forced convection of air may be provided by intake fans 60 and/or exhaust fans 61 to move air through the spaces if natural convection does not provide sufficient cooling. This embodiment may be beneficial when a moderate level of cooling is required such as in the aforementioned data archive. In FIG. 9, the modules 3 are shown as having no horizontal spacing between the modules 3. In other embodiments, horizontal spacing between the modules 3 can be provided to allow airflow or equivalent between adjacent modules 3. The spacing between modules 3, the placement of any fans 60, 61 and any required airflow partitions 62 are not facets of this present technology. Various configurations of fans 60, 61 and airflow partitions 62 that are known in the art may be used.

Figure 10:
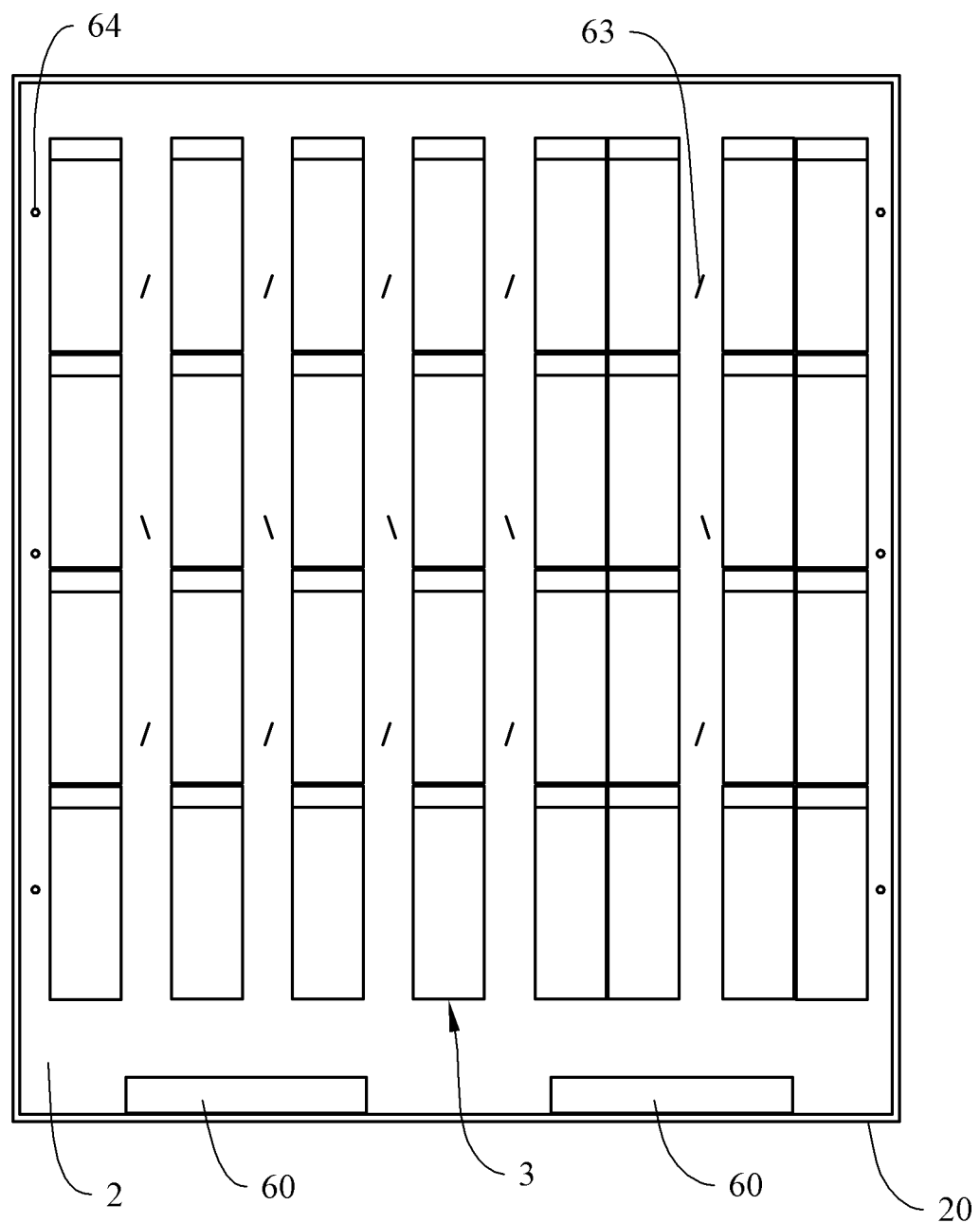
FIG. 10 is a front view of columns of modules where there are air channels between those columns and further showing optional turbulence-inducing structures and optional double-packing of modules.

In an embodiment, shown in FIG. 10, the modules 3 are arranged in vertical columns and there are vertical air channels between the columns to facilitate cooling. The modules 3 can be arranged singly in each column, as shown for the leftmost four columns, which is a chosen embodiment when the modules 3 require heat transfer from both vertical sides. Alternatively, the modules 3 can be arranged in columns consisting of a plurality of side-by-side modules 3, as shown for the rightmost two columns. For example, columns consisting of two side-by-side modules 3 would be a chosen embodiment when the modules 3 require heat transfer from only one vertical side. The side-by-side arrangement requires less total spatial volume since there are fewer vertical air channels. FIG. 10 shows zero vertical spacing between the modules 3, but vertical spacing can be provided to provide space to facilitate the insertion of modules 3 into the apparatus or to provide additional channels for airflow or equivalent fluid flow.

FIG. 10 shows intake fans 60 but the present technology can use natural convective cooling, forced convective cooling using intake fans 60, exhaust fans 61, a circulating fluid coolant, or any combination thereof. It is well known in the art that turbulent airflow provides for more effective heat transfer from the modules 3 than laminar airflow. FIG. 10 illustrates a further embodiment wherein fins 63, pins 64, or other turbulence-inducing structures known in the art or any combination thereof are used to impart turbulence into the airflow. The structure, orientation, and configuration of the means of imparting turbulence are known in the art and are not a facet of this present technology. As required by any particular embodiment, the fins 63 or pins 64 can be used in any of the embodiments disclosed herein.

With reference to FIG. 10, where the modules 3 are stacked in columns as the side-by-side pairs, it may be advantageous to mount some of the devices 4 in an inverted position relative to their corresponding carriers 5. As an illustrative embodiment, if the devices 4 are DSD's where one vertical side of the device 4 has better heat-transfer characteristics than the other vertical side, a chosen arrangement would be to attach the devices 4 in the modules 3 such that the vertical side having better heat transfer characteristics is in contact with the airflow or equivalent fluid flow.

An advantage of the embodiment in FIG. 10 over the embodiment in FIG. 9 is that the chimney effect of the vertical orientation of the air channels facilitates convective cooling, thereby possibly reducing or obviating the need for fans 60 or 61. Similarly, embodiments using forced convection with vertically-oriented air columns are likely to require fewer or less powerful fans 60 or 61.

Although not shown in FIG. 8, various combinations of fans 60 or 61 may be employed to enhance airflow with that embodiment, as exemplified in FIGS. 9 and 10.

Figure 11:
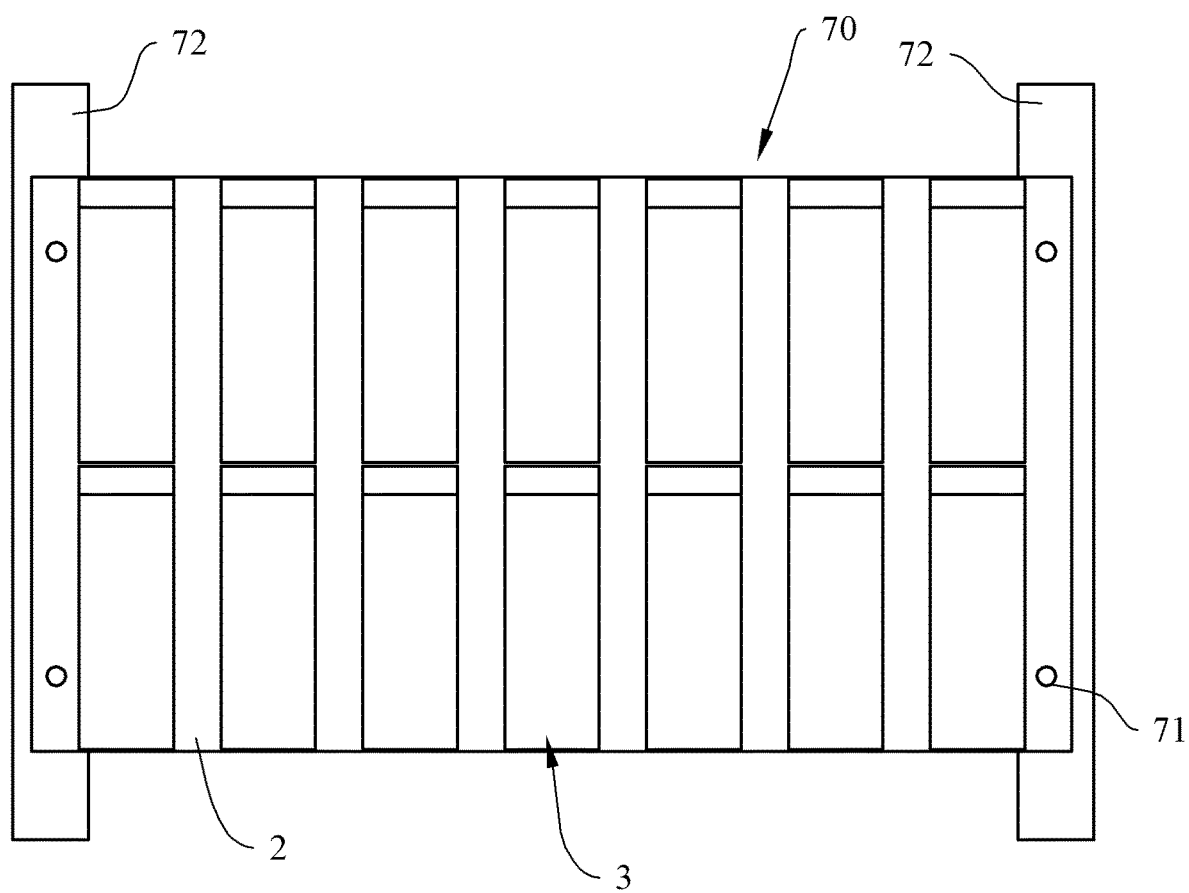
FIG. 11 is a front view of a modular assembly.

The present technology disclosed herein is well-suited for the implementation of a modular storage system. FIG. 11 shows a modular assembly 70 comprising a plurality of modules 3 mounted on a supporting structure 2 having a plurality of alignment pins 1 where, in this embodiment, the supporting structure 2 has a plurality of mounting holes 71 that are used for attaching the supporting structure 2 to a mechanical support such as mounting brackets 72 by using machine screws or other means known in the art. Various other means of attaching the supporting structure 2 to mounting brackets 72, directly to the wall of a building, or to the enclosure 20 are well known in the art, and include rivets, clips, or adhesives. The number of modules 3 in FIG. 11 is application-dependent and the modules 3 could be arranged in any configuration including, but not limited to, the configurations illustrated in FIG. 8, 9, or 10, or any combination thereof. In FIG. 11, the dimensions of mounting brackets 72 are illustrative and they could be of any dimension that is suited to a particular embodiment, including where the mounting brackets 72 shown therein are merged into a single full-width mounting bracket.

As an illustrative embodiment of a modular storage system, a plurality of modular assemblies 70 could be mounted directly on the wall of a building or on the mounting brackets 72, with or without an enclosure 20. In an exemplary embodiment of a small modular storage system, a single modular assembly 70 could be mounted in an enclosure 20 having a door 21 and, if forced-convection cooling is required, the embodiment could include intake fans 60, exhaust fans 61, or any combination thereof.

Figure 12:
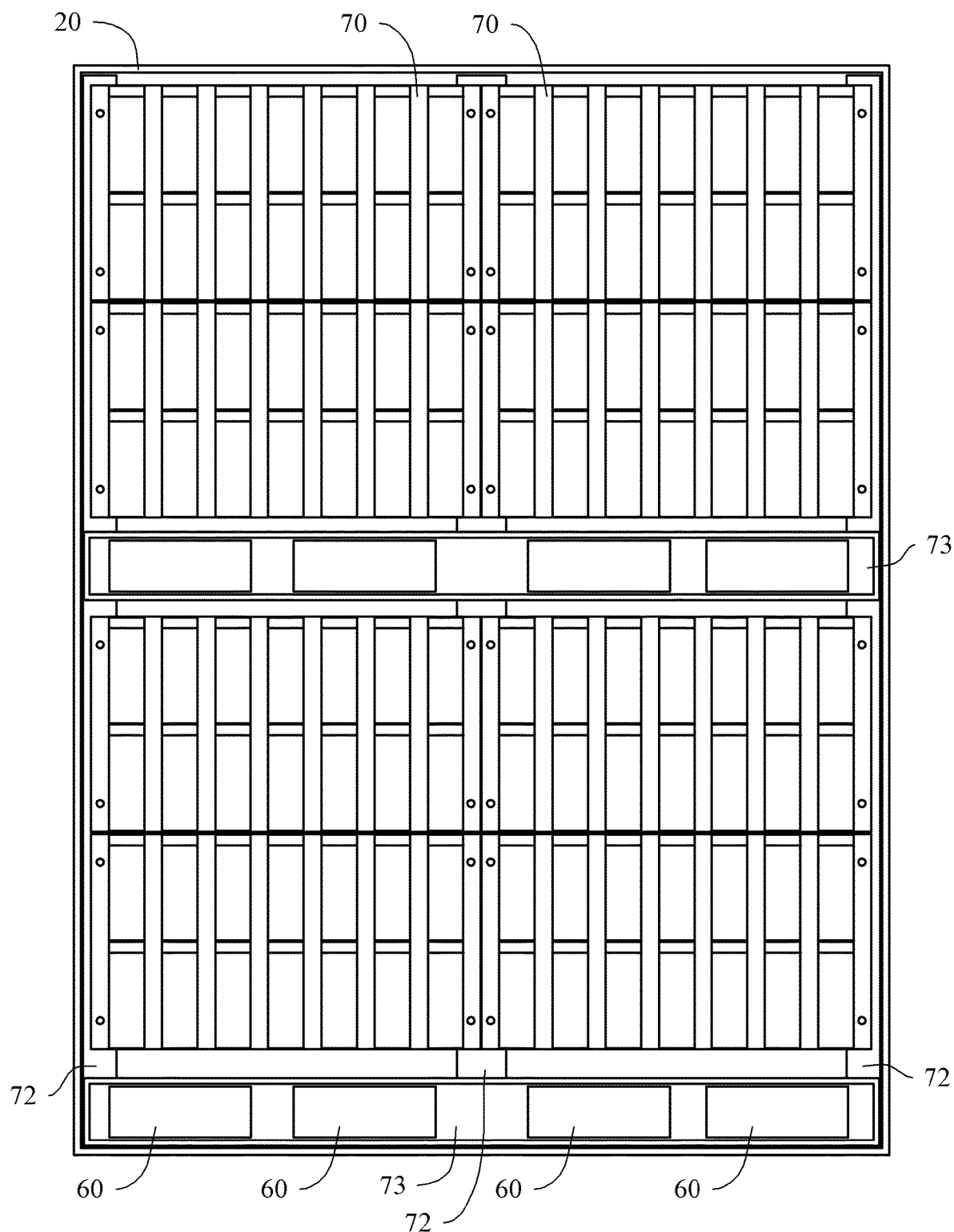
FIG. 12 is a front view of a plurality of modular assemblies inside of an enclosure where there are vertical air channels between modules and a plurality of fans.

FIG. 12 shows an embodiment where a plurality of modular assemblies 70 are mounted in a single enclosure 20 and where the modular assemblies 70 are affixed inside of the enclosure 20 to mounting brackets 72 or are affixed directly to a wall of the enclosure 20. The number of rows and columns of modular assemblies 70 in FIG. 12 is illustrative and the number of rows or columns of modular assemblies 70 is application-dependent. A first advantage of this embodiment is that a large number of modules 3 can be accommodated in a single enclosure 20. A second advantage is that the modular assemblies 70 can share a means of heat transfer, exemplified by the plurality of fans 60 shown in FIG. 12. Any required means of inducing turbulence in the airflow using methods known in the art such as fins 63 or pins 64 are not shown in FIG. 12.

In FIG. 12 it can be seen that there are air channels located between the vertical columns of modules 3 such that air will flow from the intake fans 60 upward through the air channels and the air could be exhausted through openings in the top of the enclosure 20.

In existing data storage systems, the components with the highest rate of failure are the DSD's and the fans 60, 61. The current present technology is beneficial in this regard since it facilitates easy replacement of the modules 3. It may be of further benefit if each fan 60, 61 or plurality of fans 60, 61 can be replaced as a removable module, as shown by the exemplary full-width fan modules 73 containing fans 60 in FIG. 12. FIG. 12 shows both a lower-level fan module 73 and a mid-level fan module 73, thereby illustrating that any number of fan modules 73 may be employed. The exhaust airflow or equivalent fluid flow could be enhanced by adding exhaust fans 61 or a fan module 73 at or near the top of the enclosure, but the means of enhancing the exhaust airflow are not shown in FIG. 12.

Figure 13:
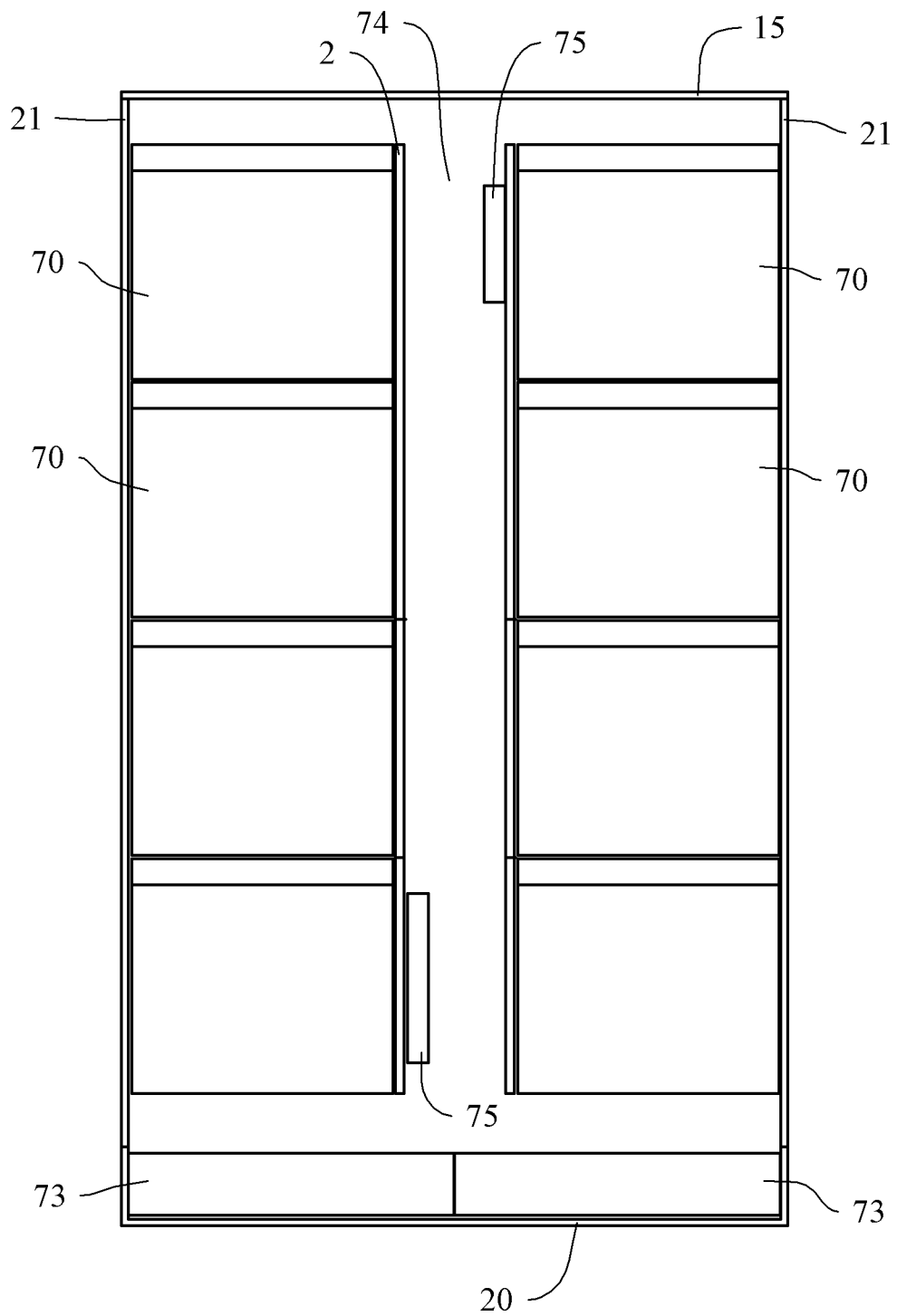
FIG. 13 is a side view of a plurality of modular assemblies stacked back-to-back inside of an enclosure.

FIG. 13 shows a side view of another embodiment of the present technology. A plurality of modular assemblies 70 (as exemplified in the front view shown in FIG. 11) are placed back-to-back in a single enclosure 20 having doors 21 for accessing the modules 3. It can be appreciated that the plurality of modular assemblies 70 can be arranged in side-to-side in the enclosure 20. For clarity, the nearest wall of the enclosure 20 and any required support brackets 72 are not shown. This configuration includes an air space 74 between the back sides of the modular assemblies 70 wherein can be placed additional aforementioned system components 75 such as CPUs, single-board computers, DSD's, cabling, communications interfaces, power supplies, or any combination thereof as shown by the exemplary placement of such system components 75. In this exemplary embodiment the direction of airflow is from bottom to top and the airflow may be by natural convection, forced convection, or any combination thereof. Any number of levels of fans 60, 61 or fan modules 73 may be incorporated in this embodiment, as exemplified in FIGS. 9, 10, and 12.

Figure 14:
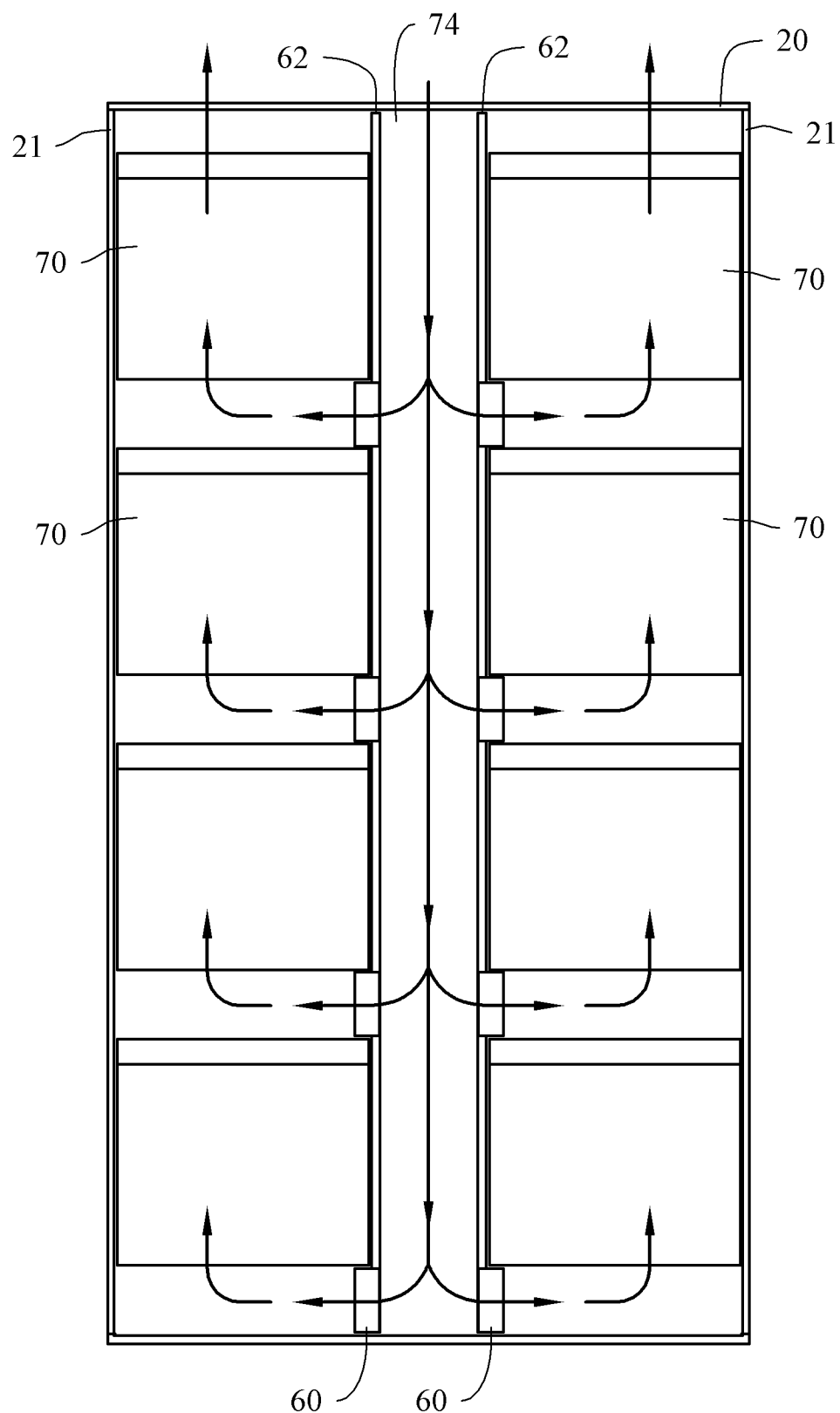
FIG. 14 is a side view of a plurality of modular assemblies stacked back-to-back where airflow enters from the top of the enclosure.

In FIG. 14, a further exemplary embodiment is shown where the intake airflow enters from the top of the enclosure 20 and the air space 74 acts as a plenum space for the intake airflow. It may be necessary to include airflow partitions 62 or other such structures known in the art to realize the plenum space. Exemplary directions for the airflow are shown by thick arrows where the airflow exits the air space 74 at one or more levels within the enclosure 20 to provide airflow for cooling the modular assemblies 70 and the airflow is exhausted through the top of the enclosure 20. As with preceding embodiments, airflow may be enhanced by using one or more intake fans 60, exhaust fans 61, fan modules 73, or any combination thereof. An exemplary placement of a plurality of intake fans 60 is shown in FIG. 14. For clarity, any required additional system components 75 that are mounted in the air space 74 are not shown in FIG. 14. The embodiment illustrated in FIG. 14 could be readily adapted for use when the intake airflow is through the bottom of the enclosure.

The embodiments in FIGS. 8 through 14 are also suitable for modules 3 that require cooling when only a subset of the modules are concurrently active. In this context, the term active implies that the module 3 is generating enough heat such that the module 3 requires cooling. In an illustrative embodiment, the devices 4 are DSD's that are part of a large data storage system such as a data archive. When the stored data is accessed infrequently, the DSD's can be powered down or be put into a low-power state when rapid access to the stored data is not required. A data storage system where a subset of the DSD's are concurrently active and where the choice of the subset can be based on thermal constraints is disclosed in U.S. Pat. No. 5,423,046 to Nunnelley et al. (1995). An advantage of having some of the modules 3 inactive is that less total heat is generated by the plurality of modules 3. Further, if surfaces of the modules 3 are thermally conductive, the heat generated by any active module 3 can be conducted to the supporting structure 2 or to adjacent inactive modules 3 that are in thermal contact with the active module 3 thereby increasing the effective surface area for heat transfer from the active modules 3. In this case, the supporting structure 2 or the inactive adjacent modules 3 can effectively act as heat sinks for the active modules 3.

With reference to the embodiments in FIGS. 8 through 14 when fans 60 or 61 are employed, the corresponding embodiments will normally have an enclosure 20 with multiple sides plus one or more doors 21 such that the sides of the enclosure 20 plus the doors 21 surrounds the supporting structure 2 and the modules 3 on all sides so that the airflow can be directed through the interior of the enclosure 20. Such a surrounding enclosure 20 may also be used when natural convective airflow provides a sufficient means of heat transfer.

Figure 15:
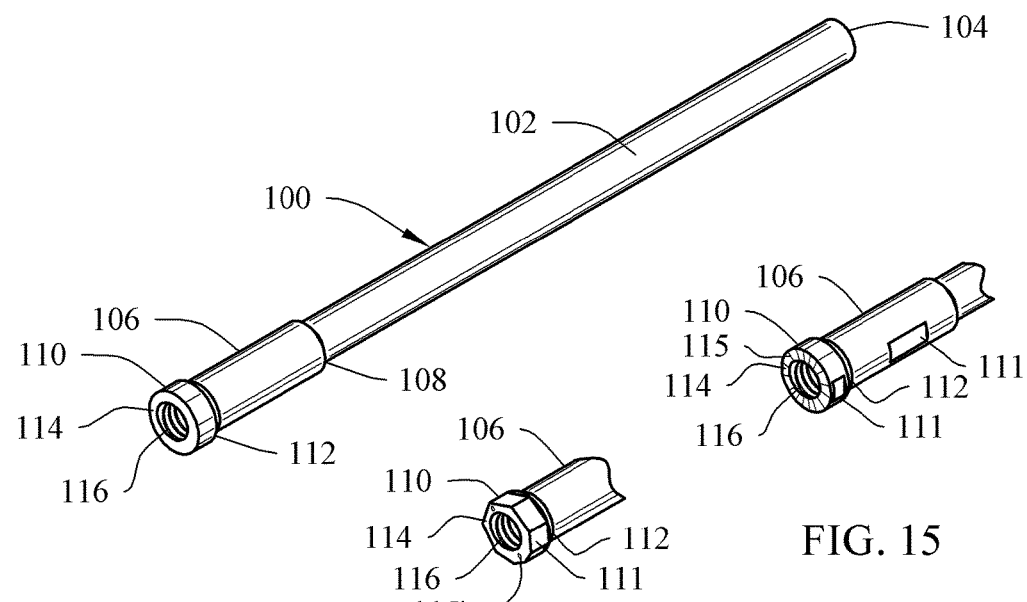
FIG. 15 is a perspective view of an embodiment of the alignment pin of the present technology.
Figure 16:
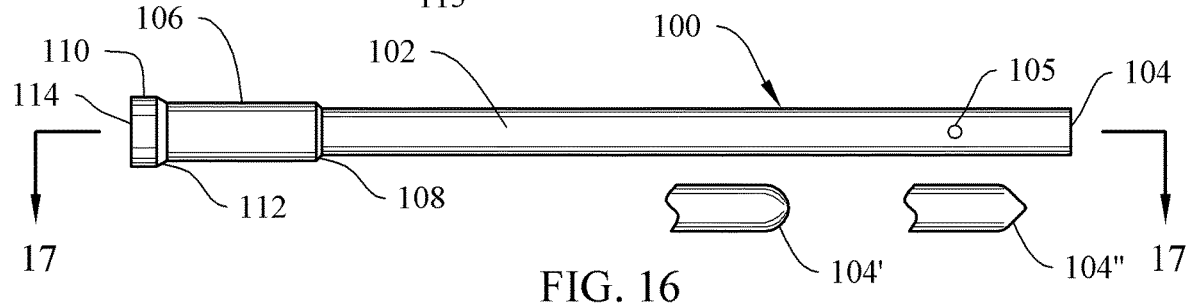
FIG. 16 is a side view of the alignment pin of the present technology.
Figure 17:
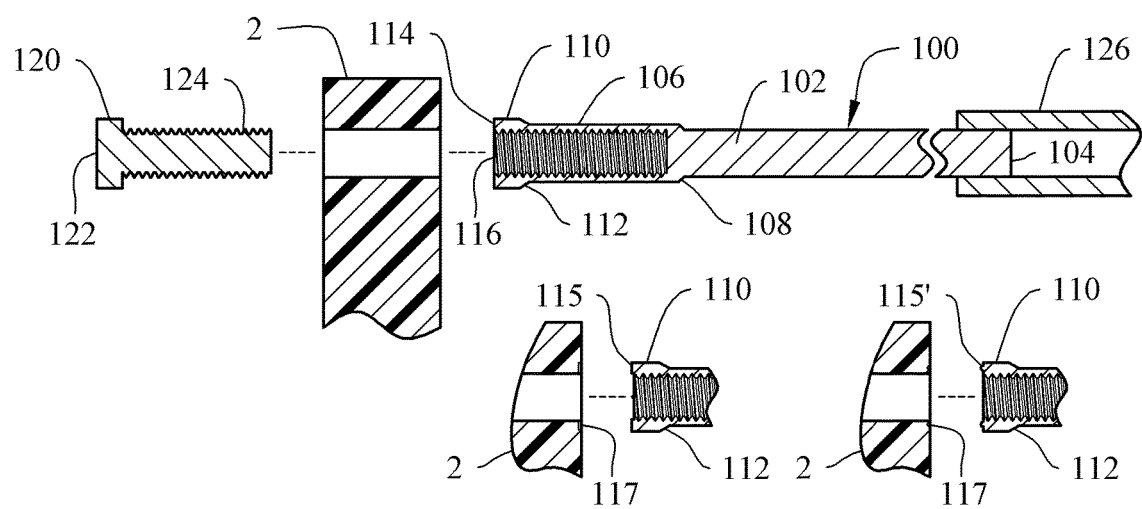
FIG. 17 is a cross-sectional view of the alignment pin of the present technology with the mounting fastener and the supporting structure or printed circuit board exploded taken along line 17-17 in FIG. 16.

Referring now to FIGS. 15-17, an embodiment of the alignment pin 100 of the present technology for mounting of a plurality of removable modules where the modules can be densely packed within the apparatus and where physical alignment of the module is maintained during insertion and removal so that the modules are easily inserted or removed is illustrated and will be described. More particularly, the alignment pin 100 can include a first pin section 102, a central pin section 106 adjacent to the first section 102, and a second pin section 110 adjacent to the central section 106. Together, these section can be configured as an elongated pin having a single longitudinal axis, and where the alignment pin 100 can be made of any suitable material such as, but not limited to, metals, plastics, wood, ceramics, alloys and the like.

The first section 102 can feature a distal end 104 and an elongated body with a first diameter or width. A first pin transition section 108 can be a beveled, chamfered, filleted or arcuate section that transitions between the first section 102 and the central section 106. In the exemplary, the distal end 104 can have a laterally flat surface, a rounded or bull nose tip 104' or a pointed tip 104", as best illustrated in FIG. 16.

The central section 106 can have a diameter or width greater than the first section 102, thereby creating the first pin transition section 108. A second pin transition section 112 can be a beveled, chamfered, filleted or arcuate section that transitions between the central section 106 and the second section 110.

The second section 110 can have a diameter or width greater than the central section 106, thereby creating the second pin transition section 112. The second section 110 can include a proximal end 114 featuring a flat surface. In the exemplary, the second section 110 can include a cylindrical configuration. In the alternative, the second section 110 can include a geometrical profile with planar surfaces 111 configured for utilization with a tool such as, but not limited to, a wrench, pliers or a socket. Further in the alternative, the second section 110 and/or the central section 106 can include recessed planar sections 111' configured for utilization with a tool such as, but not limited to, a wrench, pliers or a socket.

A fastener bore 116 can be defined through the second section 110 and into the central section 106, where the fastener bore 116 can be defined along the longitudinal axis of the alignment pin 100, as best illustrated in FIG. 17. It can be appreciated that the fastener bore 116 can extend into the first section 102 or can only be defined in the second section 110.

In the exemplary, a pin mounting fastener 120 can be utilized to mount and/or secure the alignment pin 100 to the PCB or the supporting structure 2. The pin mounting fastener 120 can include a head 122 and a threaded shaft section 124 smaller than the head 122. The threaded shaft section 124 is receivable through a hole in the PCB 2 and then engageable with the fastener bore 116 of the alignment pin 100. Tightening of the pin mounting fastener 120 secures the alignment pin 100 to the PCB 2 sandwiched between the head 122 and the second section 110 of the alignment pin 100.

In an exemplary operation, the tool can be engaged with any one of the planar surfaces 111, 111' to assist in rotation of the alignment pin 100 and thus securely engaging the alignment pin 100 with the pin mounting fastener 120 and accordingly mounting on the PCB 2.

Still further in the exemplary, the proximal end 114 of the second section 110 can include radially arranged detents, grooves or teeth 115 or pins 115', as best illustrated in FIG. 15. The teeth 115 or pins 155' can be configured to engage with corresponding radial slots or holes 117 defined in an area radially surrounding the hole in the PCB 2 or visa versa, as best illustrated in FIG. 17. It can be appreciated that tightening of the pin mounting fastener 120 with the alignment pin 120 will bring the proximal end 114 toward the PCB 2 so that the teeth 115 or pins 115' will engage with their corresponding slots or holes 117 thereby preventing the alignment pin 100 from rotating and thus providing a secure mounting of the alignment pin 100 to the PCB 2.

To assist in an automated or manual assembly of the alignment pin 100 to the PCB 2, the alignment pin 100 can include a thru-hole 105 in order to aid in a robotic alignment and insertion/removal of the alignment pin 100 utilizing a robotic or automated system (not shown). Alone or in combination with the thru-hole 105, the robotic or automated system can utilize a socket 126 configured to receiving at least a portion of the alignment pin 100 for manipulation of the alignment pin 100. The socket can include a socket pin configured to engage with the thru-hole 105 and/or can include a magnetic or a magnetizable element configured to secure with the alignment pin 100 or portion thereof.

It can be appreciated that other fasteners or fastening devices can be utilized in the scope of the present technology to secure the alignment pin 100 to the PCB 2. For example, but not limited to, clips, clamps, snaps, latches and the like can be utilized.

Further in the alternative, the second section 110 of the alignment pin 100 can include a threaded stud (not shown) extending out therefrom. This threaded stud can be engageable with a threaded section or nut that is integral with or associated with the PCB 2. In this example, rotating the alignment pin 100 would engage the threaded stud with the threaded section thereby securing the alignment pin 100 to the PCB 2 without the use of the pin mounting fastener 120.

Figure 18:
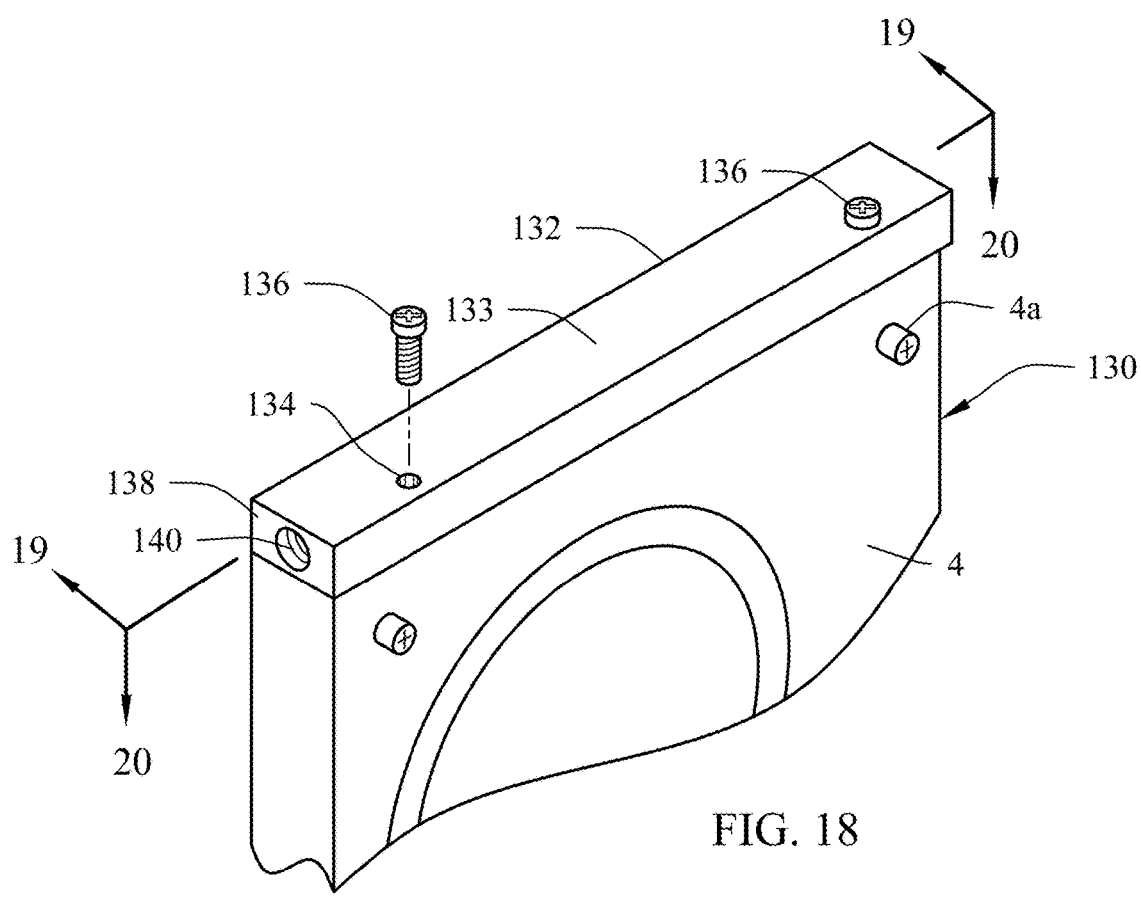
FIG. 18 is a perspective view of an embodiment of the carrier of the present technology.
Figure 19:
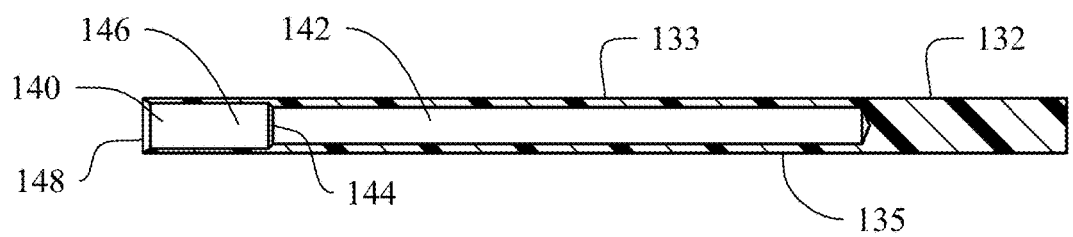
FIG. 19 is a cross-sectional view of the carrier of the present technology taken along line 19-19 in FIG. 18.
Figure 20:
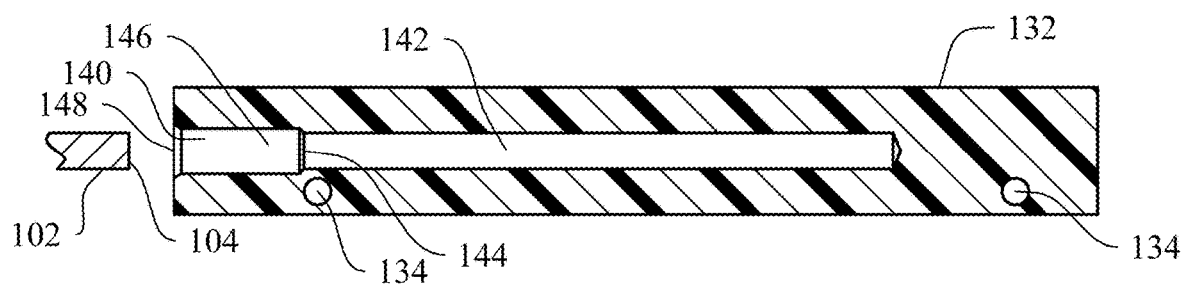
FIG. 20 is a cross-sectional view of the carrier of the present technology receiving the alignment pin taken along line 20-20 in FIG. 18.

Referring now to FIGS. 18-20, an embodiment of the carrier 132 of the present technology is illustrated and will be described in association with a drive device 4 to form a drive module 130. More particularly, the carrier 132 can include an elongated body having a first longitudinal side 133 and a second longitudinal side 135 opposite the first longitudinal side 133, one or more drive mounting holes 134 defined therethrough and lateral to a longitudinal axis of the carrier 132. Drive mounting fasteners 136 can be utilized to secure the carrier 132 to a side or edge of the drive device 4 so that the side or edge of the drive device 4 abuts the second longitudinal side 135 so that the drive device 4 is entirely extending away from the second longitudinal side 135 of the carrier 132 in a direction opposite the first longitudinal side 133. The drive mounting holes 134 can be offset from the longitudinal axis of the carrier 132, and can be aligned with or offset from other drive mounting holes 134. The carrier 132 can be made of any suitable material such as, but not limited to, metals, plastics, wood, ceramics, alloys and the like. Further, the carrier 132 can be transparent or translucent allowing for the transmission of light from proximity of the PCB 2 through the carrier 132 so that a plurality of system status indicators such as LED's can be easily viewed by the system operator.

A pin receiving bore 140 can be defined in the carrier 132 and can be along the longitudinal axis of the carrier 132, as best illustrated in FIGS. 19 and 20. The pin receiving bore 140 can include a first bore section 142, and a second bore section 146. The first bore section 142 can be of a first diameter or width that corresponds with or is capable of receiving the first pin section 102 of the alignment pin 100. A first bore transition section 144 can be a beveled, chamfered, filleted or arcuate section that transitions between the first bore section 142 and the second bore section 146. The shape or configuration of the first bore transition section 144 can correspond with or compliment the first pin transition section 108 of the alignment pin 100.

The second bore section 146 can have a diameter or width greater than the first bore section 142, thereby creating the first bore transition section 144. Further, the diameter or width of the second bore section 146 can correspond with or be capable of receiving the central section 106 of the alignment pin 100.

The pin receiving bore 140 can included an open end 148 configured to receive the at least the first and central sections 102, 106 of the alignment pin 100 therethrough. This open end 148 can be a beveled, chamfered, filleted or arcuate section that can correspond with or compliment the second transition section 112 of the alignment pin 100. Further, the open end 148 can be sized to receive the second section 110 of the alignment pin 100.

In the exemplary, the size of the open end 148 can provide a frictional securing means against the second section 110 of the alignment pin 100, thereby securing the carrier 132 or drive module 130 to the alignment pin 100 in a removable manner. Further in the exemplary, an exterior of the second section 110 of the alignment pin 100 and an interior surface of the open end 148 and/or second bore section 146 can feature mutually engageable elements to provide securement. In the exemplary, the mutually engageable elements can be, but not limited to, kinks, spirals, internal knobs, detents, ratchets, ribs, magnets, constricting diameter, or any structural element that is capable of securing the carrier 132 to the alignment pin 100 until a predetermined force is application to the carrier to remove it therefrom. Still further, a spring or biasing element can be associated between the PCB 2 and the carrier 132 to provide an ejection force against the carrier 132 to push the carrier 132 away from the PCB 2 when the carrier 132 is unlocked, unlatched or released from the alignment pin 100.

The second section 110 can have a diameter or width greater than the central section 106, thereby creating the second transition section 112. The second section 110 can include a proximal end 114 featuring a flat surface.

In operation, with the alignment pin 100 fitted to the PCB 2, the carrier 132 can be secured to the drive device 4 to create the drive module 130. Then, the drive module 130 can be mounted to the PCB 2 by sliding the carrier 132 onto the alignment pin 100 so that at least the first and central sections 102, 106 are received in the first and second bore sections 142, 146 of the pin receiving bore.

In this configuration, connectors of the drive device 4 are engageable with connectors of the PCB 2 when the drive module 130 is fully mounted on the alignment pin 100. The present technology allows for the quick removal and replacement of drive devices 4 to the PCB 2 without having to remove the PCB 2 or an entire piece of equipment featuring the PCB 2. This further allows for the "hot" removal and replacement of drive devices 4 with the PCB 2 without turning off the computer, service, drive array or the like.

It can be appreciated that a length of the carrier 132 can be configured to allow sufficient support with the alignment pin 100 while permitting the contacts of the PCB 2 and the drive device 4 operatively engage.

With the carrier 132 only covering one side or edge of the drive device 4, it can be appreciated that the remaining sides and edges of the drive device 4 are unobstructive to the surrounding air. Accordingly, allowing for greater efficiency in cooling or heat dissipation of the drive device 4. This is a substantial advantage over known drive cases.

Figure 21:
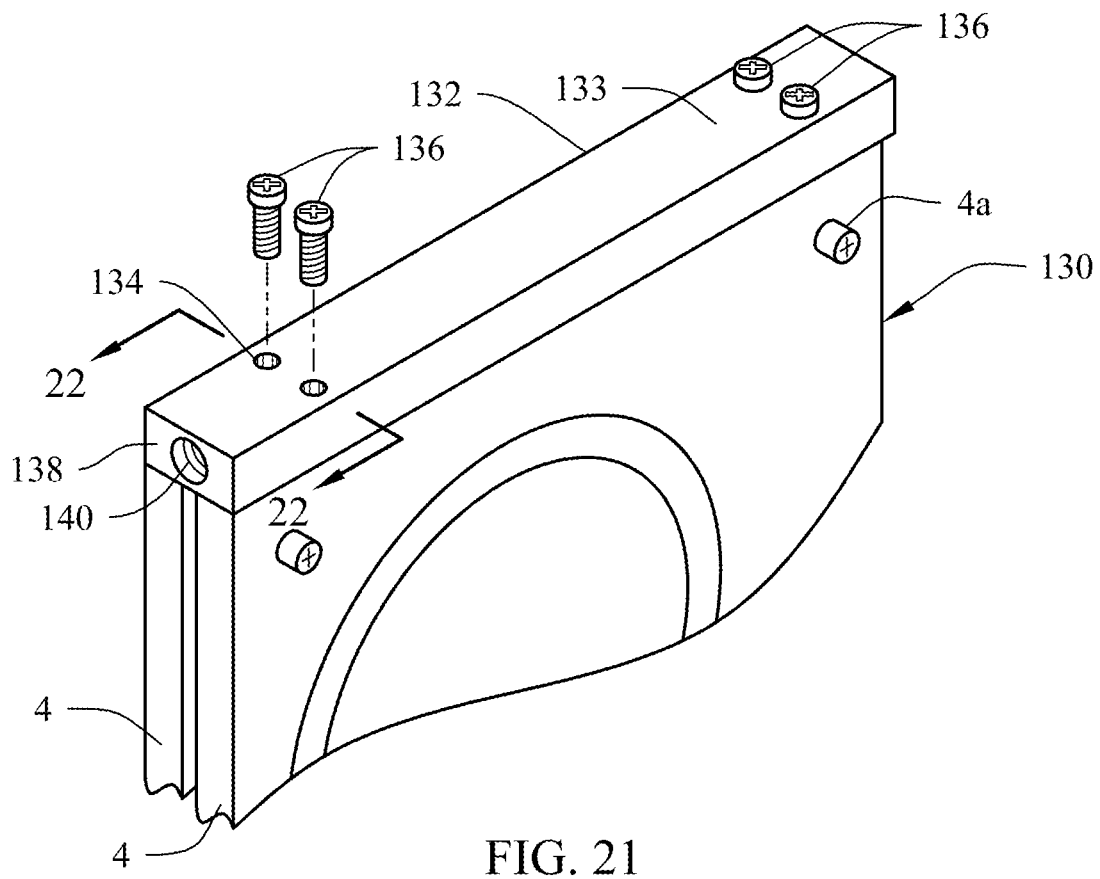
FIG. 21 is a perspective view of an embodiment of the carrier configured to accommodate two spaced apart drive devices.
Figure 22:
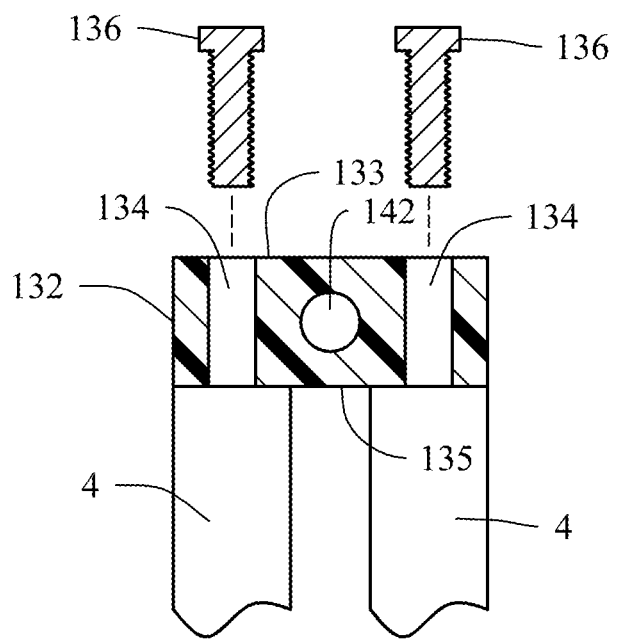
FIG. 22 is a cross-sectional view of the carrier taken along line 22-22 in FIG. 21.

Referring to FIGS. 21-22, the carrier 132 can be configured to accommodate two or more drive devices 4 in a spaced apart relationship to define an airspace or gap therebetween. To accomplish this, the carrier 132 can have a width large enough to allow two drive devices 4 to be affixed thereto in said spaced apart relationship.

Further, the carrier 132 can include additional drive mounting holes 134 arranged to allow for additional drive mounting fasteners 136 to be utilized to securing the carrier 132 to a side or edge of each of the drive devices 4. The drive mounting holes 134 can be offset from the longitudinal axis of the carrier 132, and can be aligned with or offset from other drive mounting holes 134. It can be appreciated that the carrier 132 can include two, four, six, ext. drive mounting holes 134 to accommodate one, two, three, ext. drive devices 4.

In the exemplary, the drive devices 4 can be, but not limited to, two skinny (usually 7 mm) media (usually SSD) drives that can hang from a single carrier 132. In this adjacent and spaced apart relationship, the two drive devices 4 share each other's heat, but each is cooled by the airgap therebetween and the air flowing therearound.

Figure 24:
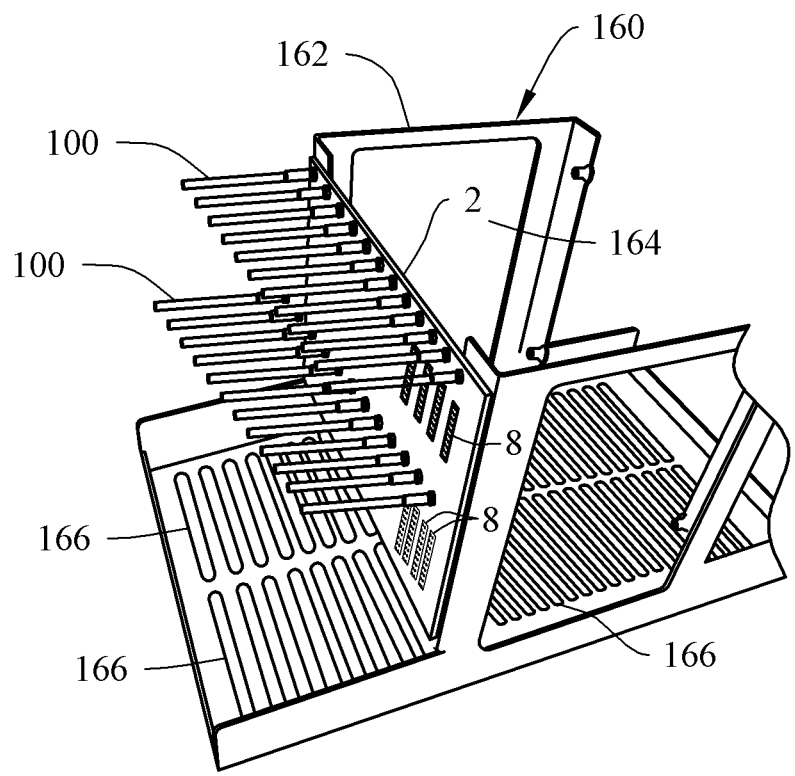
FIG. 24 is a perspective view of a rack or enclosure system of the present technology including a printed circuit board and multiple alignment pins.

Related to that also is corresponding paired placement of media electrical connectors 8 on the PCB 2 that are offset from each other, as best illustrated in FIG. 24. The contacts 8 can be, but not limited to, Serial AT Attachment (SATA), Serial Attached SCSI (SAS), U.2, U.3 and SFF-TA-1001 and variants thereof.

This offset between the pair of contacts 8 provides a means for thicker drive devices 4 can also fit into the PCB 2, and allows for the attachment of thicker drive devices with pairs of thin drive devices on the same PCB 2. The mixing of different sized drive devices 4 on a single PCB 2 can maximize storage density, which is in contrast to utilizing two different PCBs that previously have be required. The use of two different PCBs precludes the function of swapping thin and thick drive devices dynamically while in service.

Figure 23:
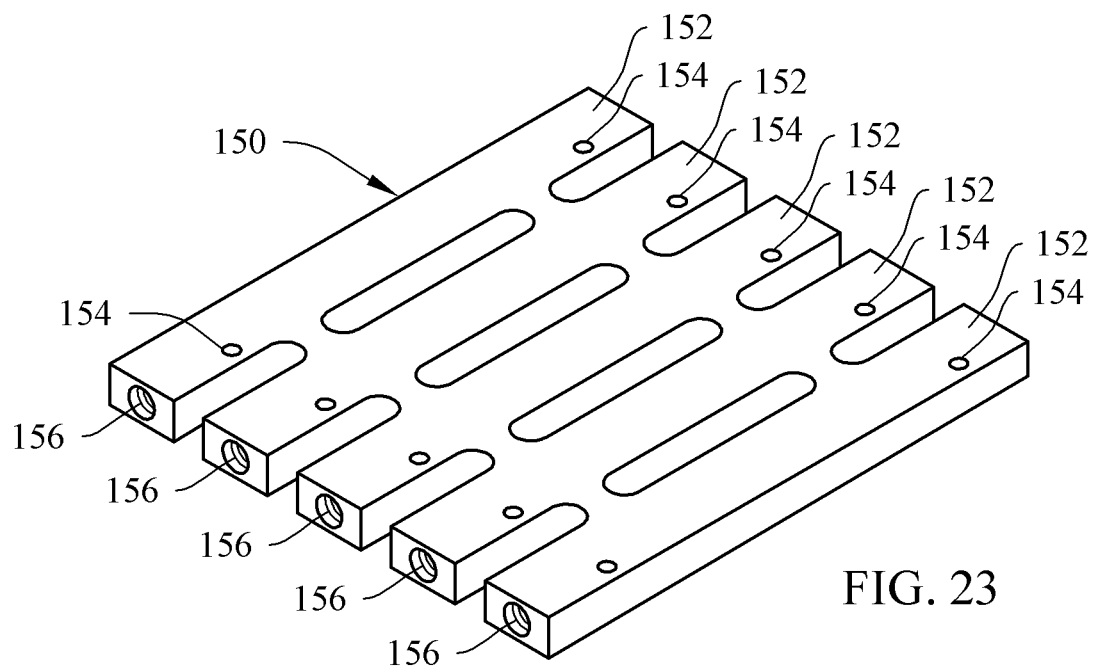
FIG. 23 is a perspective view of an embodiment of a multiple carrier of the present technology.

Referring to FIG. 23, an alternate multiple carrier 150 can be utilized to mount multiple drive devices to a single carrier. In this embodiment, the multiple carrier 150 can include multiple carrier sections 152 each including drive mounting holes 154, and a pin receiving bore 156. The drive mounting holes 154 of each carrier section 152 allows for a single drive device to mounted thereto.

Space or distance between each of the pin receiving bores 156 corresponds to the space or distance between adjacent alignment pins mounted on the PCB.

The present technology can further include a modular rack system 160, as best illustrated in FIG. 24 and in the exemplary. The rack system 160 can be attachable to other similar rack systems in a vertical/stacked arrangement and/or in a horizontal/side-by-side arrangement. This allows for the adaptable configuration of multiple racks. The exemplary rack system can be housed inside any of enclosures of the present technology, and can be configured as a module allowing for expansion of the drive system.

The rack system 160 can include a general open framework 162 with openings 164 and slots 166 to allow sufficient airflow or equivalent fluid flow therethrough. The PCB 2 can be mounted to the framework 162 with multiple alignment pins 100 secured to the PCB 2. With multiple drive modules mounted to the PCB 2, air can easily medium or air flow through the openings 164 and slots 166 of the rack system 160 to cool off or dissipate heat from each of the drive modules. Further, with only the carrier being mounted to one side or edge of the drive device, then air can efficiently flow between each drive module in direct contact with a majority of the surface of the drive device. Consequently, this increased surface contact with the medium or air flow more efficiently cools the or dissipates heat from the drive devices.

Further in the exemplary, FIG. 24 illustrates how the PCB 2 can include a single contact 8 or a pair of contacts 8 associated with an alignment pin 100, thereby supporting the utilization of a drive module 130 with a single drive device 4 or a pair of drive devices 4. It can be appreciated that the PCB 2 can include any number and/or arrangement of alignment pins 100 and any number and/or arrangement of contacts 8.

The present technology can be implemented so that multiple drive devices 2 are removably mounted to one or more PCBs 2 so that an air gap is defined between sides and ends of adjacent drive devices 2 with only the carrier 132 on one edge of the drive devices 2 obstructing air flow.

Figure 25:
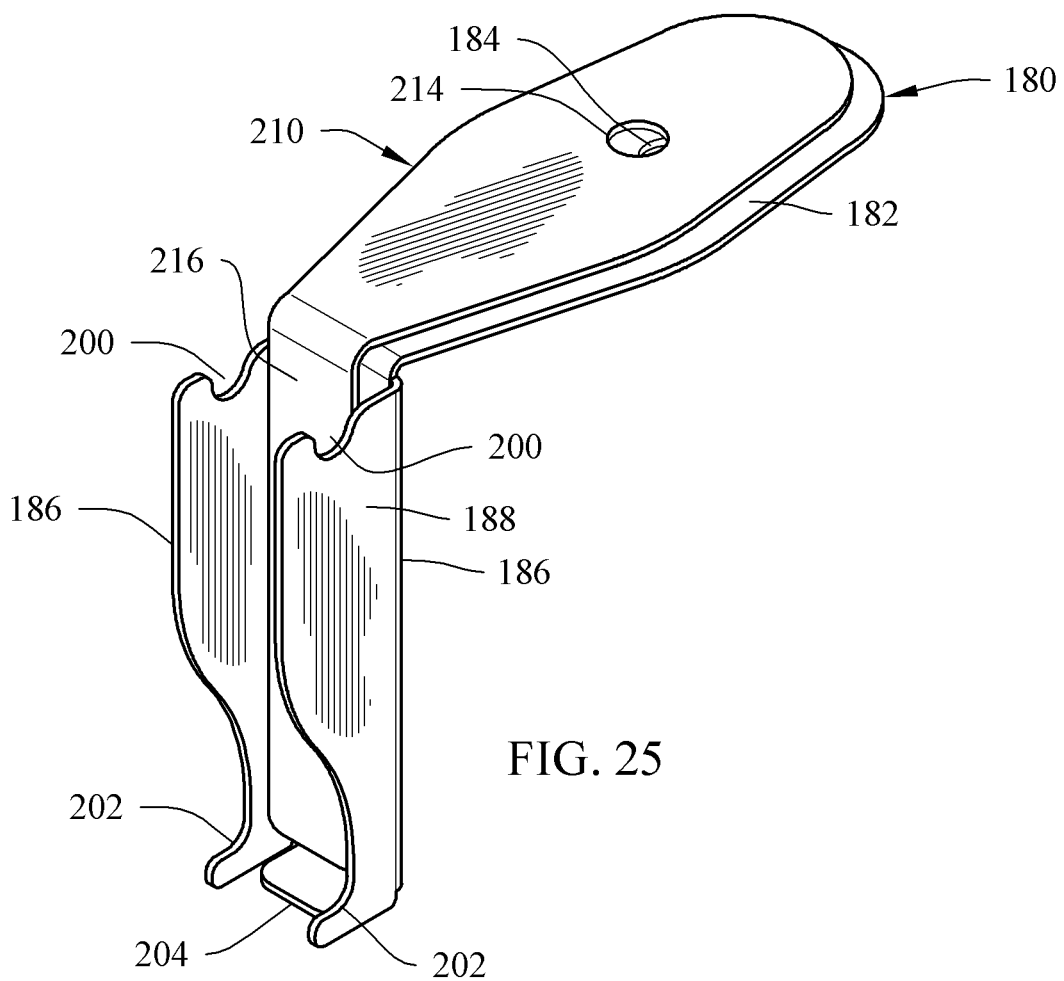
FIG. 25 is a perspective view of a module tool of the present technology capable of carrying, inserting and/or removing the module.
Figure 26:
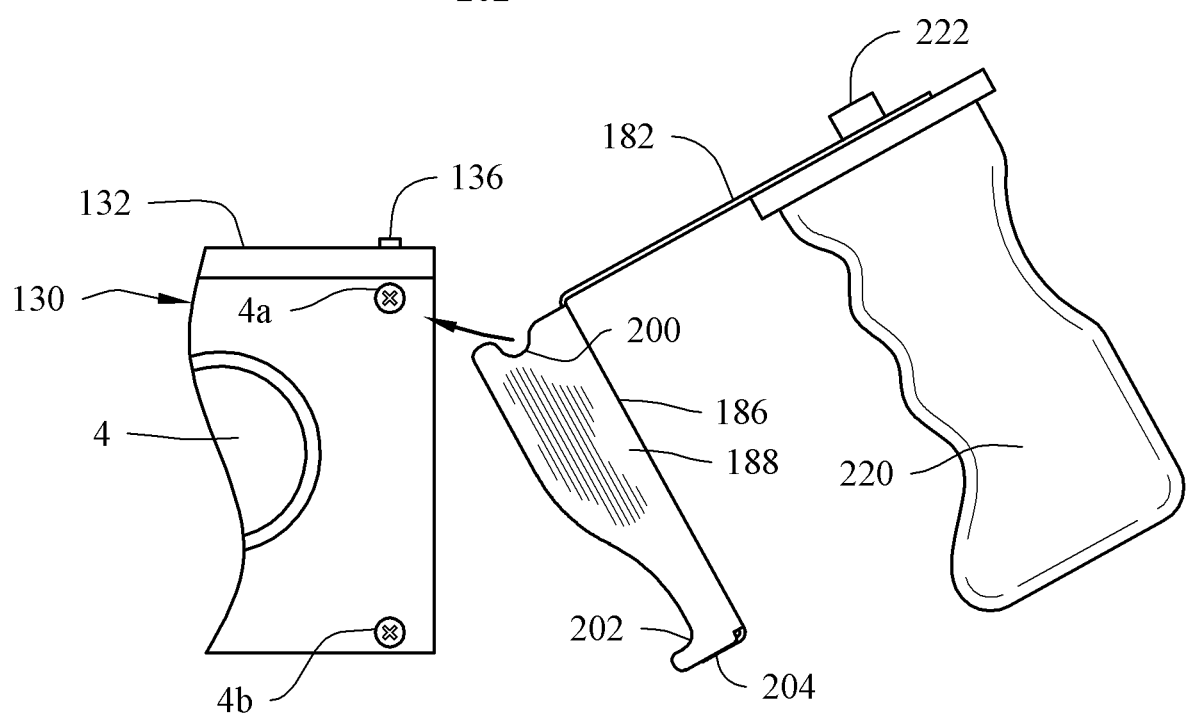
FIGS. 26-28 are side views of the module tool of the present technology in use and including a hand grip.

Referring now to FIGS. 25 and 26, an insert/removal tool 180 can be utilized with the present technology. The tool 180 is configured to be fitted to the drive device 4 of the drive module 130, while allowing handling and manipulation of the drive module 130 for insertion and/or removal thereof with the alignment pin.

The tool 180 can include a handle section 182 featuring a mounting hole 184, a back section 186 extending from the handle section 182, a pair of side sections 188, and a bottom section 204. The back section 186 can extend from the handle section 182 at an angle, and in some cases perpendicular with the handle section 182.

Each side section 188 includes a first recess 200 defined in an upper edge thereof near the handle section 182, and a second recess 202 near the bottom section 204. The first recess 200 is configured to receive a first part of the drive device 4 or a fastener head 4a associated with a first set of fasteners fitted to each side of the drive device 4, and the second recess 202 is configured to receive a second part of the drive device 4 or a fastener head 4b associated with a second set of fasteners fitted to each side of the drive device 4. The first recess 200 can be configured as a cradle capable of receiving the fastener head 4a from an open area above the tool 180. The second recess 202 can be configured as a ledge capable of receiving the fastener head 4b from an open area in front of the tool 180.

The bottom section 204 can be perpendicular to the back section 186 and/or side sections 188 to create a section that can support a side of the drive device 4 opposite to that of the carrier 132, as best illustrated in FIG. 26.

A secondary tool 210 can be utilized with the tool 180 to provide a disengagement force to the drive module 130 that removes the tool 180 from the drive module 130. This secondary tool 210 can include a handle section 212 featuring a mounting hole 214, and a back section 216 extending from the handle section 212. The back section 216 can extend from the handle section 212 at an angle, and in some cases perpendicular with the handle section 182. The handle section 212, the mounting hole 214 and the back section 216 can have a configuration corresponding with the handle section 182, the mounting hole 184 and the back section 186 of the tool 180. The back section 216 is configured to be receivable between the pair of side sections 188.

The disengagement force can be a biasing force created from the angle between the handle section 212 and the back section 216 when the drive module 130 is pressed against the back section 216.

A hand grip 220 can be utilized with the tool 180, including the secondary tool 210. The hand grip 220 can have an ergonomic configuration, and can be attached to the handle section 182 of the tool 180 utilizing a grip fastener 222 operably associated with the mounting hole 184. It can be appreciated that the secondary tool 210 can be operable fitted with the tool 180, and the grip fastener 222 operable associated with the mounting holes 184, 214 of both the tool 180 and the secondary tool 210.

Figure 27:
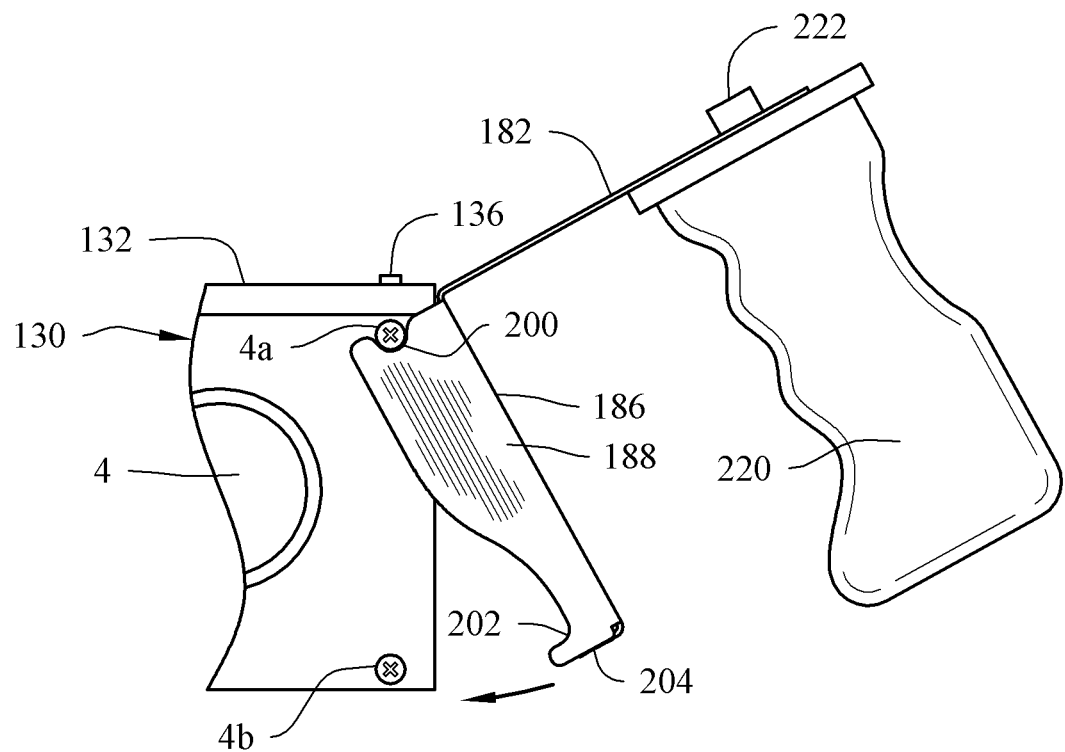
Figure 28:
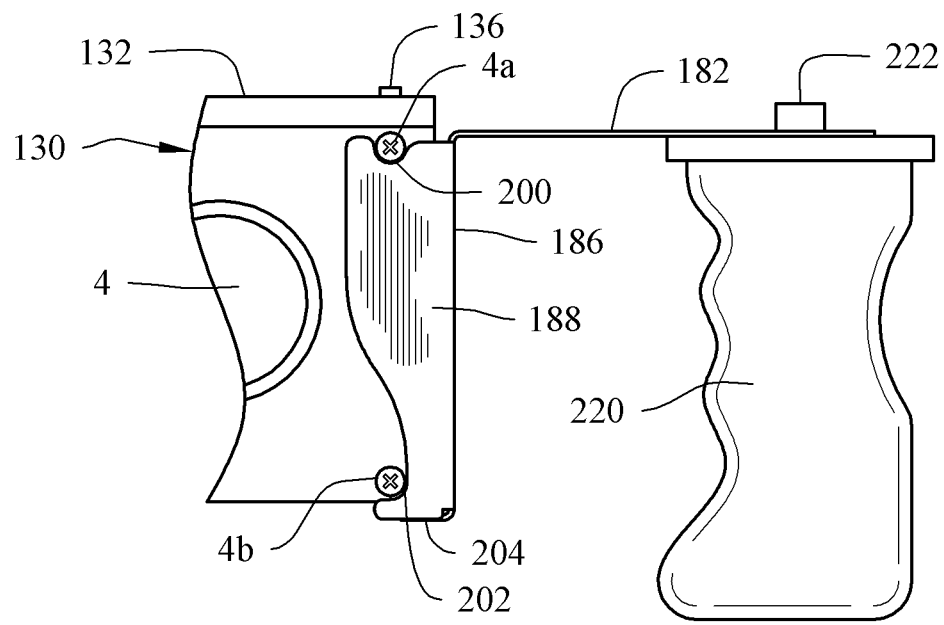

In use and as best illustrated in FIGS. 26-28, it can now be understood that the tool 180 can be tilted at an angle sufficient and positioned toward the drive module 130 so that an edge of the drive devices 4 is received between the side sections 188 and the fastener heads 4a are received in their corresponding first recess 200. Then, the tool 180 can be rotated about the fastener heads 4a so that the fastener heads 4b are received in their corresponding second recess 202. In this arrangement, the drive module 130 is supported by the fastener heads 4a, 4b in their corresponding recesses 200, 202. Further support can be achieved by a portion of the drive device 4 resting on the bottom section 204.

With the drive module 130 fitted to the tool 180, a user can insert the drive module 130 on the alignment pin so the contacts of the drive device and the PCB are engaged, or the user can remove the drive module 130 form the PCB.

In use, the present technology can include a method of mounting an electronic device 4 to a printed circuit board 2 using any embodiment of the electronic device mounting system. The method can include the steps of attaching a carrier 5, 132, 150 to one or more electronic devices 4. Then, mounting the electronic devices 4 to the printed circuit board 2 by sliding the carrier 5, 132, 150 onto an alignment pin 1, 100 affixed to the printed circuit board 2 so that the alignment pin 1, 100 is received in a pin bore 6, 140, 156 defined in the carrier 5, 132, 150.

In some or all embodiments, the carrier 5, 132, 150 can further include one or more drive bores 7, 134, 154 configured to receive a fastener configured to secure the carrier 5, 132, 150 to the electronic device 4.

In some or all embodiments, the pin bore 6, 140, 156 of the carrier 5, 132, 150 can include a first bore section 142 having a first diameter or width, and a second bore section 146 having a second diameter or width greater than the first diameter or width. The second bore section 146 can be adjacent the first bore section 142 and an open end 148 of the carrier 5, 132, 150.

In some or all embodiments, the alignment pin 1, 100 can include a first pin section 102 that can have a first pin diameter or width receivable in the first bore section 142, and a central pin section 106 that can have a central pin diameter or width receivable in the second bore section 102. The central pin diameter or width of the central pin section 106 can be greater than the first pin diameter or width of the first pin section 102.

In some or all embodiments, the alignment pin 1, 100 can include a second pin section 110 adjacent to the central pin section 106 so that the central pin section 106 is between the first pin section 102 and the second pin section 110. The second pin section 110 can have second pin diameter or width greater than the central pin section 106.

In some or all embodiments, the alignment pin 1, 100 can define a fastener bore 116 configured to operable receive a pin fastener 120 configured to affix the alignment pin 1, 100 to the printed circuit board 2.

In some or all embodiments, the electronic device 4 can be a data storage device.

Some or all embodiments of the present technology can include a means of restricting movement of the electronic device 4 along the alignment pin 1, 100, the means of restricting movement is selected from the group consisting of magnets, mechanical fasteners, a translational detent, by inclining the alignment pin above a horizontal plane, and a door on an enclosure containing the printed circuit board 2 and the electronic device 4.

In some or all embodiments, the printed circuit board 2 can include one or more connectors 8 for a transfer of one or combination of power, electrical signals, heat, optical signals or fluids between the printed circuit board 2 and one or more of the electronic devices 4.

Some or all embodiments of the present technology can include an enclosure configured to enclose the printed circuit board 2, the alignment pin 1, 100 and the electronic device 4.

In some or all embodiments, the alignment pin 1, 100 can be a plurality of alignment pins arranged on the printed circuit board 2. The carrier 5, 132, 150 and the electronic device 4 attached to the carrier form a cartridge module 3, 130. Each of the alignment pins 5, 132, 150 can be configured to support the cartridge module 3, 130 so that multiple cartridge modules are arranged in a back-to-back and/or side-to-side configuration defining a space provided between backsides and/or sides of the cartridge modules 3, 130.

In some or all embodiments, the space can be a plenum space for airflow or fluid flow.

In some or all embodiments, the space for the airflow or fluid flow can be provided between one or more horizontal rows of the cartridge modules 3, 130 or between one or more vertical columns of the cartridge modules 3, 130.

Some or all embodiments of the present technology can include one or more fans to provide airflow or fluid flow through the space.

In some or all embodiments, the carrier 150 can include multiple carrier sections 152 each including the pin bore 156 and each being attachable to at least one of the electronic device 4.

In some or all embodiments, the carrier 5, 132 can be configured to be attachable to two or more electronic devices 4.

In some or all embodiments, the carrier 5, 132 can be a single carrier configured to be mounted on a single alignment pin 1, 100 mountable on a single printed circuit board 2 that includes a pair of offset contacts 8 operably arranged on the printed circuit board 2 so that a pair of electronic devices 4 mounted to the single carrier 5, 132 are operable connectable to the pair of contacts 8, respectively, when the single carrier 5, 132 is mounted to the single alignment pin 1, 100.

Some or all embodiments of the present technology can include a tool 180 configured to support the electronic device 4 with the carrier 5, 132, 150 attached to the electronic device. The tool 180 can include a handle section 182 configured to be grasped by a hand of a user or configured to be attachable to a hand grip 220. The tool 180 can include a pair of side sections 188 in a spaced apart relationship configured to receive an edge of the electronic device 4 therebetween, and each of the side sections 188 can include one or more recesses 200, 202 configured to receive a part of the electronic device 4 or a fastener 4a, 4b associated with the electronic device 4.

Those skilled in the art will recognize that for any of the embodiments disclosed herein that use an enclosure 20, 160, if the cooling airflow or equivalent fluid flow is forced into the enclosure under pressure, as exemplified in WIPO Patent Application WO 2010/144677A1, the need for fans 60, 61 within the enclosure 20, 160 may be reduced or eliminated.

Note that any holes or slots in the enclosure 20, 160 that are required for air exchange with the environment outside of the enclosure 20, 160 are not shown in FIG. 3 or FIGS. 8 through 14 since the shape and location of the holes or slots may be known in the art.

Herein, the orientation of the alignment pin 1, 100 has been shown to be in the horizontal plane. However, the present technology can be used with alignment pins 1, 100 in any orientation.

A further embodiment has a supporting structure 2 that is oriented in the horizontal plane and has a plurality of vertical alignment pins 1, 100, which is beneficial when the modules 3, 130 are mounted in drawers, such as is shown with the DSD's in FIG. 2 of U.S. Pat. No. 10,856,436 and FIG. 1C of U.S. Pat. No. 9,232,683. In such applications, in addition to aligning the module 3, 130 during insertion into the drawer, each of the alignment pins 1, 100 can serve as a cantilever beam thereby providing support for its corresponding module 3, 130.

Although some embodiments of the present technology have been presented in the context of DSD's, those skilled in the art will recognize that the disclosed alignment and mounting apparatus is applicable to other modular systems including, but not limited to, modules 3, 130 that have no further connection to the supporting structure 2 or modules 3, 130 that are connected to the supporting structure 2 for the exchange of fluids, heat, optical signals, power, electrical signals, or any combination thereof.

Those skilled in the art will recognize that the plurality of modules 3, 130 can be heterogeneous. In an illustrative embodiment, the plurality of devices 4 in the modules 3, 130 could comprise various electronic devices including conventional spinning DSD's, SSDs, CPUs, single-board computers, data interfaces, heat exchange apparatus, or any combination thereof. Since the heterogeneous modules 3, 130 can have differing physical sizes, the apparatus can utilize nonuniform spacing of the alignment pins 1, 100 to accommodate the differing sizes.

The modules 3, 130 illustrated herein have been shown to have a rectangular cross section in the plane parallel to the supporting structure 2. Those skilled in the art will recognize that modules 3, 130 having non-rectangular cross sections can be accommodated by other embodiments of the present technology. To maximize the packing density for some of these non-rectangular cross sections, it may be necessary to offset the position of the alignment pins 1, 100 for alternating rows of modules 3, 130. For example, with reference to FIG. 7: for modules 3, 130 having a circular or hexagonal cross section, the horizontal offset is one-half of the horizontal spacing of the alignment pins 1, 100.

Those skilled in the art will recognize that in further embodiments of the present technology, the alignment pin 1, 100 could be mounted on the carrier 5, 132 such that the alignment pin 1 can be inserted into a corresponding hole in the supporting structure 2.

Herein, wherever heat transfer has been described in terms of cooling the modules 3, 130, those skilled in the art that will recognize that heating of the modules 3, 130 can be accomplished using similar means.

Herein, the term fluid refers to any liquid, gas, or mixture thereof.

Inasmuch as the dimensions of the embodiments describe herein depend on the dimensions that are required to accommodate the physical properties of a particular device 4 and any cooling required thereof, dimensions are not a facet of this present technology.

While embodiments of the cartridge module alignment and mounting system, apparatus and method have been described in detail, it should be apparent that modifications and variations thereto are possible, all of which fall within the true spirit and scope of the present technology. With respect to the above description then, it is to be realized that the optimum dimensional relationships for the parts of the present technology, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present technology. For example, any suitable sturdy material may be used instead of the above-described. And although mounting of a plurality of removable modules where the modules can be densely packed within the apparatus and where physical alignment of the module is maintained during insertion and removal so that the modules are easily inserted or removed have been described, it should be appreciated that the cartridge module alignment and mounting system, apparatus and method herein described is also suitable for mounting multiple electronic devices in a close proximity to each other allow for sufficient air flow therebetween and therearound.

Therefore, the foregoing is considered as illustrative only of the principles of the present technology. Further, since numerous modifications and changes will readily occur to those skilled in the art, it is not desired to limit the present technology to the exact construction and operation shown and described, and accordingly, all suitable modifications and equivalents may be resorted to, falling within the scope of the present technology.

What is claimed as being new and desired to be protected by Letters Patent of the United States is as follows:

1. A cartridge module mounting system comprising a carrier attachable to one or more electronic devices, the carrier including an elongated body having a first longitudinal side and a second longitudinal side opposite the first longitudinal side, a pin bore defined in the elongated body along a longitudinal axis of the elongated body, and one or more drive mounting holes defined through the elongated body lateral to the longitudinal axis and offset with the pin bore; wherein the pin bore being configured to receive an alignment pin affixed to a printed circuit board; wherein the pin bore of the carrier including a first bore section having a first diameter or width, and a second bore section having a second diameter or width greater than the first diameter or width, the second bore section being adjacent the first bore section and an open end of the carrier; and wherein the drive mounting holes being configured for receiving a fastener therethrough to secure an electronic device to the second longitudinal side so that the electronic device is entirely extending away from the second longitudinal side of the carrier in a direction opposite the first longitudinal side.

2. The cartridge module mounting system according to claim 1, wherein the alignment pin including a first pin section having a first pin diameter or width receivable in the first bore section, and a central pin section having a central pin diameter or width receivable in the second bore section, the central pin diameter or width of the central pin section being greater than the first pin diameter or width of the first pin section.

3. The cartridge module mounting system according to claim 2, wherein the alignment pin including a second pin section adjacent to the central pin section so that the central pin section is between the first pin section and the second pin section, the second pin section having second pin diameter or width greater than the central pin section.

4. The cartridge module mounting system according to claim 2, wherein the alignment pin defining a fastener bore configured to operable receive a pin fastener configured to affix the alignment pin to the printed circuit board.

5. The cartridge module mounting system according to claim 1, wherein the electronic devices is a data storage device.

6. The cartridge module mounting system according to claim 1 further comprising a means of restricting movement of the electronic devices along the alignment pin, the means of restricting movement is selected from the group consisting of magnets, mechanical fasteners, a translational detent, by inclining the alignment pin above a horizontal plane, and a door on an enclosure containing the printed circuit board and the electronic devices.

7. The cartridge module mounting system according to claim 1, wherein the printed circuit board includes one or more connectors for a transfer of one or combination of power, electrical signals, heat, optical signals or fluids between the printed circuit board and the electronic devices.

8. The cartridge module mounting system according to claim 1 further comprising an enclosure configured to enclose the printed circuit board, the alignment pin and the electronic devices.

9. The cartridge module mounting system according to claim 1, wherein the alignment pin is a plurality of alignment pins arranged on the printed circuit board, and wherein the carrier and the electronic devices attached to the carrier forms a cartridge module, and wherein each of the alignment pins is configured to support the cartridge module so that multiple cartridge modules are arranged in a back-to-back configuration defining a space provided between backsides of the cartridge modules.

10. The cartridge module mounting system according to claim 9, wherein the space is a plenum space for airflow or fluid flow.

11. The cartridge module mounting system according to claim 10, wherein the space for the airflow or fluid flow is provided between one or more horizontal rows of the cartridge modules or between one or more vertical columns of the cartridge modules.

12. The cartridge module mounting system according to claim 9 further comprising one or more fans to provide airflow or fluid flow through the space.

13. The cartridge module mounting system according to claim 1, wherein the carrier includes multiple carrier sections each including the pin bore and each being attachable to at least one of the electronic devices.

14. The cartridge module mounting system according to claim 1, wherein the alignment pin includes planar surfaces configured for utilization with a tool.

15. A cartridge module mounting system comprising:
one or more alignment pins affixable to a printed circuit board; and
one or more carriers attachable to one or more electronic devices, the carriers each including an elongated body having a first longitudinal side and a second longitudinal side opposite the first longitudinal side, a pin bore defined in the body along a longitudinal axis of the body, and one or more drive mounting holes defined through the body lateral to the longitudinal axis and offset with the pin bore;
wherein the pin bore being configured to receive at least one of the alignment pins thereby removably connecting the electronic devices to the printed circuit board so that a space is defined between adjacent electronic devices;
wherein the pin bore of the carrier including a first bore section having a first diameter or width, and a second bore section having a second diameter or width greater than the first diameter or width, the second bore section being adjacent the first bore section and an open end of the carrier;
wherein the drive mounting holes being configured for receiving a fastener therethrough to secure the electronic devices to the second longitudinal side so that the electronic devices are entirely extending away from the second longitudinal side of the carrier in a direction opposite the first longitudinal side.

16. The cartridge module mounting system according to claim 15, wherein the alignment pins each comprising:
a first pin section having a first pin diameter or width receivable in the first bore section;
a central pin section having a central pin diameter or width receivable in the second bore section, the central pin diameter or width of the central pin section being greater than the first pin diameter or width of the first pin section;
a second pin section adjacent to the central pin section so that the central pin section is between the first pin section and the second pin section, the second pin section having second pin diameter or width greater than the central pin section; and
a fastener bore configured to operable receive a pin fastener configured to affix the alignment pins to the printed circuit board.

17. A method of mounting a cartridge module to a printed circuit board using a cartridge module mounting system, the method comprising the steps of:
a) attaching a second longitudinal side of an elongated body of a carrier to one or more electronic devices utilizing a fastener through one or more drive mounting holes defined through the elongated body lateral to a longitudinal axis of the elongated body, wherein the carrier comprising a pin bore defined in the elongated body along the longitudinal axis of the elongated body, wherein the drive mounting holes are offset with the pin bore, and wherein the pin bore of the carrier including a first bore section having a first diameter or width, and a second bore section having a second diameter or width greater than the first diameter or width, the second bore section being adjacent the first bore section and an open end of the carrier; and
b) mounting the electronic devices to the printed circuit board by sliding the carrier onto an alignment pin affixed to the printed circuit board so that the alignment pin is received in the pin bore defined in the carrier and so that the electronic devices are entirely extending away from the second longitudinal side of the carrier in a direction opposite a first longitudinal side of the elongated body.

* * * * *